(12) United States Patent
Shang et al.

(10) Patent No.: US 12,211,447 B2
(45) Date of Patent: Jan. 28, 2025

(54) SHIFT REGISTER CIRCUIT AND DRIVING METHOD THEREOF, GATE DRIVING CIRCUIT, AND DISPLAY DEVICE

(71) Applicant: BOE TECHNOLOGY GROUP CO., LTD., Beijing (CN)

(72) Inventors: Guangliang Shang, Beijing (CN); Jiangnan Lu, Beijing (CN); Long Han, Beijing (CN); Li Wang, Beijing (CN); Libin Liu, Beijing (CN); Xinshe Yin, Beijing (CN); Shiming Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/765,045

(22) PCT Filed: Mar. 23, 2021

(86) PCT No.: PCT/CN2021/082241
§ 371 (c)(1),
(2) Date: Mar. 30, 2022

(87) PCT Pub. No.: WO2022/198427
PCT Pub. Date: Sep. 29, 2022

(65) Prior Publication Data
US 2024/0071312 A1 Feb. 29, 2024

(51) Int. Cl.
*G09G 3/3266* (2016.01)
*G11C 19/28* (2006.01)

(52) U.S. Cl.
CPC ... *G09G 3/3266* (2013.01); *G09G 2310/0286* (2013.01); *G09G 2310/08* (2013.01); *G09G 2330/021* (2013.01); *G11C 19/287* (2013.01)

(58) Field of Classification Search
CPC ......... G09G 3/3266; G09G 2310/0286; G09G 2310/08; G09G 2330/021; G09G 3/3233; G09G 3/20; G11C 19/287; G11C 19/28
See application file for complete search history.

(56) References Cited

U.S. PATENT DOCUMENTS

2008/0100560 A1  5/2008  Na et al.
2012/0269315 A1  10/2012 Jang et al.
(Continued)

FOREIGN PATENT DOCUMENTS

CN  105304057 A  *  2/2016  ............... G09G 1/02
CN  105609041      5/2016
(Continued)

OTHER PUBLICATIONS

Sun et al., Machine Translation of Foreign Patent Document CN 105304057A, Shift register, driving method thereof, and gate driver on array, Feb. 3, 2016, pp. 1-19 (Year: 2016).*

*Primary Examiner* — Amr A Awad
*Assistant Examiner* — Maheen I Javed
(74) *Attorney, Agent, or Firm* — Dority & Manning, P.A.

(57) ABSTRACT

A shift register circuit includes a first control sub-circuit and a first output sub-circuit. The first control sub-circuit is configured to: adjust a voltage of a first node to a turn-on voltage due to an influence of a first direct current voltage signal from a first clock signal terminal, an initial voltage signal from an initial signal terminal and a second direct current voltage signal from a second clock signal terminal; and maintain the voltage of the first node at the turn-on voltage due to an influence of a first clock signal from the first clock signal terminal and a second clock signal from the second clock signal terminal. The first output sub-circuit is configured to be turned on under a control of the turn-on (Continued)

voltage of the first node to transmit a first voltage signal from a first voltage terminal to a signal output terminal.

17 Claims, 13 Drawing Sheets

(56) References Cited

U.S. PATENT DOCUMENTS

| | | |
|---|---|---|
| 2017/0200419 A1 | 7/2017 | Ma |
| 2017/0270879 A1 | 9/2017 | Han et al. |
| 2017/0278450 A1 | 9/2017 | Ma |
| 2017/0330633 A1 | 11/2017 | Sun et al. |
| 2018/0144811 A1 | 5/2018 | Han et al. |
| 2018/0211590 A1 | 7/2018 | Zhang et al. |
| 2018/0211606 A1* | 7/2018 | Zhang ..................... G09G 3/36 |
| 2019/0057664 A1 | 2/2019 | Shi et al. |
| 2019/0180834 A1 | 6/2019 | Yuan et al. |
| 2019/0340975 A1 | 11/2019 | Zhai |
| 2019/0378448 A1 | 12/2019 | Park et al. |
| 2020/0035182 A1 | 1/2020 | Bae et al. |
| 2020/0066209 A1 | 2/2020 | Zhang et al. |
| 2020/0074912 A1 | 3/2020 | Kitsomboonloha et al. |
| 2022/0190093 A1* | 6/2022 | No ....................... G09G 3/3607 |

FOREIGN PATENT DOCUMENTS

| | | |
|---|---|---|
| CN | 108806588 | 11/2018 |
| CN | 111508433 | 8/2020 |
| EP | 3992960 | 5/2022 |
| KR | 20090027832 | 3/2009 |

* cited by examiner

SHIFT REGISTER CIRCUIT AND DRIVING METHOD THEREOF, GATE DRIVING CIRCUIT, AND DISPLAY DEVICE

CROSS-REFERENCE TO RELATED APPLICATION

This application is a national phase entry under 35 USC 371 of International Patent Application No. PCT/CN2021/082241 filed on Mar. 23, 2021, which is incorporated herein by reference in its entirety.

TECHNICAL FIELD

The present disclosure relates to the field of display technologies, and in particular, to a shift register circuit and a driving method thereof, a gate driving circuit, and a display device.

BACKGROUND

A pixel driving circuit in a display device receives a data signal, and a pixel voltage carried by the data signal may be used for controlling a light-emitting brightness of each pixel. Due to an electric leakage of the pixel driving circuit, the pixel voltage varies over time.

At present, in order to ensure that a brightness of a still screen fluctuates within a reasonable range, the data signal input to the pixel driving circuit is required to be refreshed. The power consumption of a display panel may be reduced by reducing a refresh frequency of the data signal.

SUMMARY

In an aspect, a shift register circuit is provided. The shift register circuit includes a first control sub-circuit and a first output sub-circuit.

The first control sub-circuit is coupled to a first clock signal terminal, a second clock signal terminal, an initial signal terminal and a first node. The first control sub-circuit is configured to: adjust a voltage of the first node to a turn-on voltage due to an influence of a first direct current voltage signal from the first clock signal terminal, an initial voltage signal from the initial signal terminal and a second direct current voltage signal from the second clock signal terminal; and maintain the voltage of the first node at the turn-on voltage due to an influence of a first clock signal from the first clock signal terminal and a second clock signal from the second clock signal terminal.

The first output sub-circuit is coupled to the first node, a first voltage terminal and a signal output terminal. The first output sub-circuit is configured to be turned on under a control of the turn-on voltage of the first node to transmit a first voltage signal from the first voltage terminal to the signal output terminal.

In some embodiments, the shift register circuit further includes a second control sub-circuit and a second output sub-circuit.

The second control sub-circuit is coupled to the first node, the first voltage terminal, a first control signal terminal, a second control signal terminal, a fourth clock signal terminal, a second voltage terminal, a second node and the first control sub-circuit. The second control sub-circuit is configured to: under a control of a first control signal from the first control signal terminal and a second control signal from the second control signal terminal, and due to an influence of the first voltage signal from the first voltage terminal and a fourth clock signal from the fourth clock signal terminal, adjust a voltage of the second node to a turn-on voltage; and transmit the first voltage signal from the first voltage terminal to the first control sub-circuit under a control of the first control signal from the first control signal terminal.

The second output sub-circuit is coupled to the second node, the second voltage terminal and the signal output terminal. The second output sub-circuit is configured to: be turned on under a control of the turn-on voltage of the second node to transmit a second voltage signal from the second voltage terminal to the signal output terminal.

In some embodiments, the first control sub-circuit includes a holding unit and a first control unit.

The holding unit is coupled to the first clock signal terminal, the first node and the initial signal terminal. The holding unit is configured to: be turned off due to an influence of the first direct current voltage signal from the first clock signal terminal and the initial voltage signal from the initial signal terminal; and be turned on under a control of the first clock signal from the first clock signal terminal and due to an influence of the second clock signal from the second clock signal terminal, so as to maintain the voltage of the first node at the turn-on voltage.

The first control unit is coupled to the second clock signal terminal and the first node. The first control unit is configured to: adjust the voltage of the first node to the turn-on voltage due to an influence of the second direct current voltage signal from the second clock signal terminal: and adjust the voltage of the first node due to the influence of the second clock signal from the second clock signal terminal.

In some embodiments, the holding unit includes a first transistor. A control electrode of the first transistor is coupled to the first clock signal terminal, a first electrode of the first transistor is coupled to the initial signal terminal, and a second electrode of the first transistor is coupled to the first node.

The first control unit incudes a first capacitor. A first terminal of the first capacitor is coupled to the second clock signal terminal, and a second terminal of the first capacitor is coupled to the first node.

In some embodiments, the first control sub-circuit further includes a first anti-leakage unit coupled to the first voltage terminal. The holding unit is coupled to the first node through the first anti-leakage unit. The first anti-leakage unit is configured to maintain the turn-on voltage of the first node under a control of the first voltage signal from the first voltage terminal and due to an influence of the turn-on voltage of the first node.

In some embodiments, the first anti-leakage unit includes an eleventh transistor. A control electrode of the eleventh transistor is coupled to the first voltage terminal, a first electrode of the eleventh transistor is coupled to the first node, and a second electrode of the eleventh transistor is coupled to the holding unit.

In some embodiments, the first control sub-circuit further includes a second control unit coupled to the holding unit, the second control sub-circuit, the fourth clock signal terminal and the second voltage terminal. The second control unit is configured to transmit the second voltage signal from the second voltage terminal to the holding unit under a control of the fourth clock signal from the fourth clock signal terminal and the second control sub-circuit.

In some embodiments, the second control unit includes a second transistor and a third transistor.

A control electrode of the second transistor is coupled to the second control sub-circuit, and a first electrode of the second transistor is coupled to the second voltage terminal.

A control electrode of the third transistor is coupled to the fourth clock signal terminal, a first electrode of the third transistor is coupled to a second electrode of the second transistor, and a second electrode of the third transistor is coupled to the holding unit.

In some embodiments, the second control sub-circuit includes a third control unit, a fourth control unit, an adjustment unit and a fifth control unit.

The third control unit is coupled to holding unit, the second control unit, the first control signal terminal, the fourth control unit, the adjustment unit and the first voltage terminal. The third control unit is configured to transmit the first voltage signal from the first voltage terminal to the second control unit and the fourth control unit under the control of the first control signal from the first control signal terminal.

The fourth control unit is further coupled to the fourth clock signal terminal and a third node. The fourth control unit is configured to transmit the fourth clock signal from the fourth clock signal terminal to the third node under a control of the first voltage signal output from the third control unit.

The adjustment unit is further coupled to the third node. The adjustment unit is configured to adjust a control voltage of the fourth control unit according to a voltage of the third node.

The fifth control unit is coupled to the first node, the second node, the third node, the second voltage terminal and the second control signal terminal. The fifth control unit is configured to: transmit the voltage of the third node to the second node under a control of the second control signal from the second control signal terminal; and transmit the second voltage signal from the second voltage terminal to the second node under the control of the turn-on voltage of the first node.

In some embodiments, the third control unit includes a fourth transistor and a fifth transistor.

A control electrode of the fourth transistor is coupled to the first control sub-circuit, a first electrode of the fourth transistor is coupled to the first control signal terminal, and a second electrode of the fourth transistor is coupled to the first control sub-circuit. A control electrode of the fifth transistor is coupled to the first control signal terminal, a first electrode of the fifth transistor is coupled to the first voltage terminal, and a second electrode of the fifth transistor is coupled to the first control sub-circuit and the fourth control unit.

The fourth control unit includes a sixth transistor. A control electrode of the sixth transistor is coupled to the second electrode of the fourth transistor or the fifth transistor, a first electrode of the sixth transistor is coupled to the fourth clock signal terminal, and a second electrode of the sixth transistor is coupled to the third node.

The adjustment unit includes a second capacitor. A first terminal of the second capacitor is coupled to the third node, and a second terminal of the second capacitor is coupled to the second electrode of the fourth transistor or the fifth transistor.

The fifth control unit includes a seventh transistor and an eighth transistor.

A control electrode of the seventh transistor is coupled to the second control signal terminal, a first electrode of the seventh transistor is coupled to the third node, and a second electrode of the seventh transistor is coupled to the second node. A control electrode of the eighth transistor is coupled to the first node, a first electrode of the eighth transistor is coupled to the second voltage terminal, and a second electrode of the eighth transistor is coupled to the second node.

In some embodiments, the second control sub-circuit further includes a second anti-leakage unit coupled to the first voltage terminal. The third control unit is coupled to the fourth control unit through the second anti-leakage unit. The second anti-leakage unit is configured to maintain the fourth control unit on under a control of the first voltage signal from the first voltage terminal and due to an influence of the control voltage of the fourth control unit.

In some embodiments, the second anti-leakage unit includes a twelfth transistor. A control electrode of the twelfth transistor is coupled to the first voltage terminal, a first electrode of the twelfth transistor is coupled to the fourth control unit, and a second electrode of the twelfth transistor is coupled to the third control unit.

In some embodiments, the first control signal terminal is one of the first clock signal terminal and a third clock signal terminal. And/or, the second control signal terminal is one of the second clock signal terminal and the fourth clock signal terminal.

The first clock signal terminal is configured to output the first clock signal in a data refresh phase of a frame period, to output the first direct current voltage signal in a denoising sub-phase of a data holding phase of the frame period, and to output the first clock signal in a denoising enhancement sub-phase of the data holding phase of the frame period. The second clock signal terminal is configured to output the second clock signal in the data refresh phase, to output the second direct current voltage signal in the denoising sub-phase of the data holding phase, and to output the second clock signal in the denoising enhancement sub-phase of the data holding phase. The third clock signal terminal is configured to output a third clock signal in the data refresh phase, and to output a third direct current voltage signal in the data holding phase. The fourth clock signal terminal is configured to output the fourth clock signal in the data refresh phase, and to output a fourth direct current voltage signal in the data holding phase.

In some embodiments, the first clock signal and the second clock signal are substantially mutually inverted signals, and the third clock signal and the fourth clock signal are substantially mutually inverted signals. The first direct current voltage signal and the second direct current voltage signal are low level signals, and the third direct current voltage signal and the fourth direct current voltage signal are high level signals.

In some embodiments, the second output sub-circuit includes a ninth transistor and a third capacitor.

A control electrode of the ninth transistor is coupled to the second node, a first electrode of the ninth transistor is coupled to the second voltage terminal, and a second electrode of the ninth transistor is coupled to the signal output terminal. A first terminal of the third capacitor is coupled to the second voltage terminal, and a second terminal of the third capacitor is coupled to the second node.

In some embodiments, the first output sub-circuit includes a tenth transistor. A control electrode of the tenth transistor is coupled to the first node, a first electrode of the tenth transistor is coupled to the first voltage terminal, and a second electrode of the tenth transistor is coupled to the signal output terminal.

In another aspect, a gate driving circuit is provided. The gate driving circuit includes a plurality of shift register circuits in any one of the above embodiments. The plurality of shift register circuits are cascaded in sequence.

In some embodiments, the gate driving circuit further includes one of three clock signal lines and four clock signal lines coupled to the shift register circuits in the gate driving circuit.

In yet another aspect, a display device is provided. The display device includes the gate driving circuit in any one of the above embodiments, and a plurality of control signal lines. Each shift register circuit in the gate driving circuit is coupled to at least one control signal line.

In yet another aspect, a driving method of a shift register circuit is provided, which is applied to the shift register circuit in any one of the above embodiments. A frame period includes a data holding phase, and the data holding phase includes a plurality of denoising sub-phases and a plurality of denoising enhancement sub-phases that are alternated. The driving method includes following steps.

In a denoising sub-phase, the first control sub-circuit in the shift register circuit adjusts the voltage of the first node to the turn-on voltage due to the influence of the first direct current voltage signal from the first clock signal terminal, the initial voltage signal from the initial signal terminal and the second direct current voltage signal from the second clock signal terminal.

In a denoising enhancement sub-phase, the first control sub-circuit maintains the voltage of the first node at the turn-on voltage due to the influence of the first clock signal from the first clock signal terminal and the second clock signal from the second clock signal terminal.

In the data holding phase, the first output sub-circuit in the shift register circuit is turned on under the control of the turn-on voltage of the first node to transmit the first voltage signal from the first voltage terminal to the signal output terminal.

In some embodiments, the first control sub-circuit includes the holding unit and the first control unit. The first control sub-circuit adjusting the voltage of the first node to the turn-on voltage due to the influence of the first direct current voltage signal from the first clock signal terminal, the initial voltage signal from the initial signal terminal and the second direct current voltage signal from the second clock signal terminal, includes following steps.

The holding unit is turned off due to an influence of the first direct current voltage signal from the first clock signal terminal and the initial voltage signal from the initial signal terminal. The first control unit adjusts the voltage of the first node to the turn-on voltage due to an influence of the second direct current voltage signal from the second clock signal terminal.

The first control sub-circuit maintaining the voltage of the first node at the turn-on voltage due to the influence of the first clock signal from the first clock signal terminal and the second clock signal from the second clock signal terminal, includes following steps.

The first control unit adjusts the voltage of the first node due to an influence of the second clock signal from the second clock signal terminal. The holding unit is turned on under a control of the first clock signal from the first clock signal terminal and due to an influence of the second clock signal from the second clock signal terminal to maintain the voltage of the first node at the turn-on voltage.

In some embodiments, the frame period further includes a data refresh phase, and the data refresh phase includes a first phase, a second phase, a third phase and a fourth phase.

The second control sub-circuit in the shift register circuit includes the third control unit, the fourth control unit, the fifth control unit and the adjustment unit. The driving method further includes following steps. In the first phase and the third phase, the third control unit transmits the first voltage signal from the first voltage terminal to the second control unit and the fourth control unit under the control of the first control signal from the first control signal terminal. The fourth control unit transmits the fourth clock signal from the fourth clock signal terminal to the third node under the control of the first voltage signal output from the third control unit.

In the second phase and the fourth phase, the adjustment unit adjusts the control voltage of the fourth control unit according to the voltage of the third node. The fourth control unit transmits the fourth clock signal from the fourth clock signal terminal to the third node under the control of the first voltage signal output from the third control unit. The fifth control unit transmits the voltage (i.e., the fourth clock signal) of the third node to the second node under the control of the second control signal from the second control signal terminal. The second output sub-circuit is turned on under the control of the turn-on voltage of the second node to transmit the second voltage signal from the second voltage terminal to the signal output terminal.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method, and an actual timing of a signal involved in the embodiments of the present disclosure.

DETAILED DESCRIPTION

Figure 1:
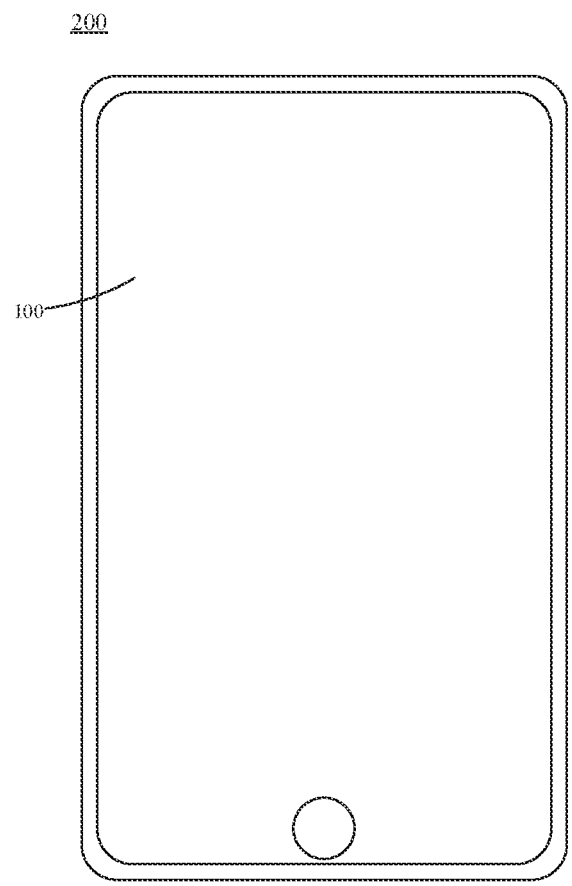
FIG. 1 is a structural diagram of a display device, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "coupled" and extensions thereof may be used. For example, the term "coupled" may be used in the description of some embodiments to indicate that two or more components are in direct physical or electrical contact with each other.

The phrase "A and/or B" includes the following three combinations: only A, only B, and a combination of A and B.

The use of the phrase "configured to" herein means an open and inclusive expression, which does not exclude devices that are applicable to or configured to perform additional tasks or steps.

The term "substantially" as used herein includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

As shown in FIG. 1, some embodiments of the present disclosure provide a display device 200 including a display panel 100. The display device 200 may be an organic light-emitting diode (OLED) display device.

The display device 200 may be any device that displays images, whether moving (e.g., videos) or stationary (e.g., still images). It is anticipated that the embodiments may be implemented in, or associated with, a variety of electronic apparatuses. The variety of electronic apparatuses are, but not limited to, mobile phones, wireless apparatuses, personal data assistants (PDAs), hand-held or portable computers, GPS receivers/navigators, cameras, MP4 video players, video cameras, game consoles, watches, clocks, calculators, television monitors, flat panel displays, computer monitors, auto displays (e.g., odometer displays), navigators, cockpit controllers and/or displays, camera view displays (e.g., rear-view camera displays in vehicles), electronic photos, electronic billboards or signs, projectors, architectural structures, packagings, and aesthetic structures (e.g., displays for displaying an image of a piece of jewelry).

A description will be made in an example where the display panel 100 is an OLED display panel in following embodiments of the present disclosure.

Figure 2A:
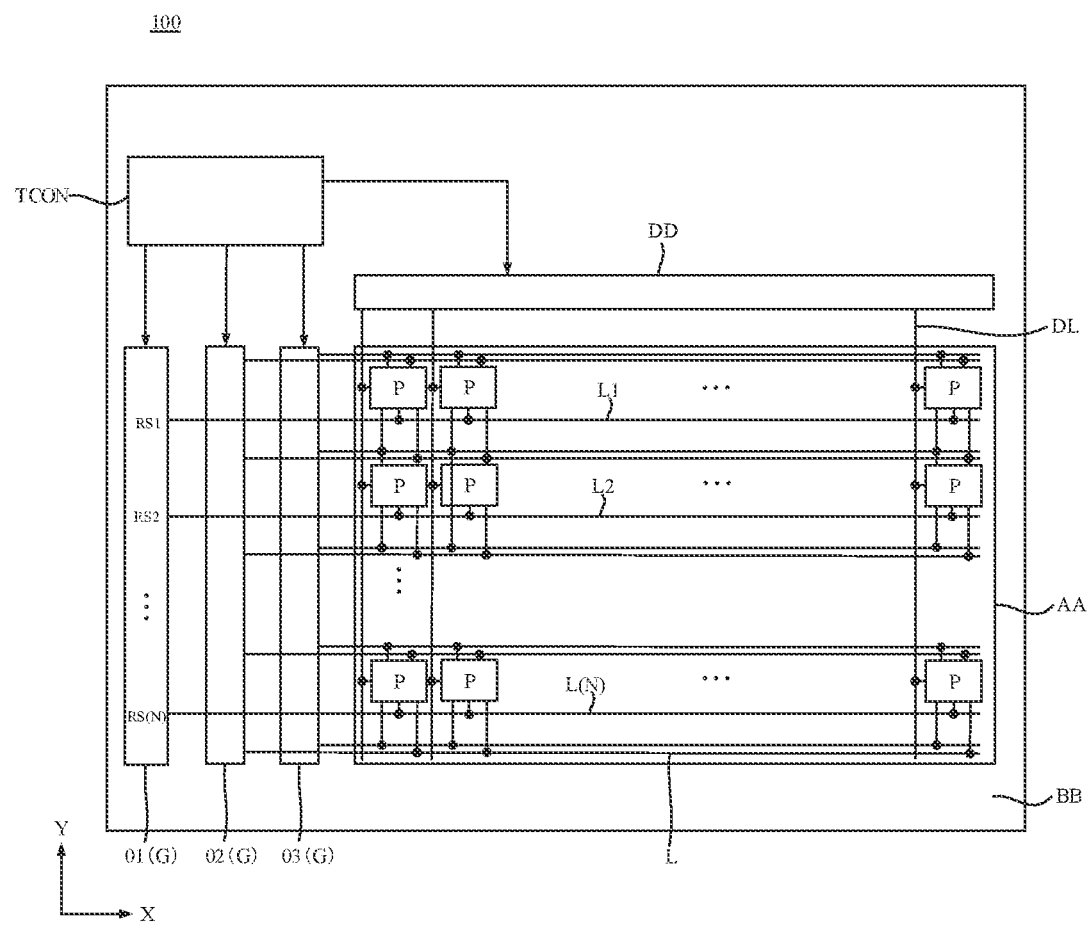
FIG. 2A is a structural diagram of a display panel, in accordance with some embodiments of the present disclosure.

As shown in FIG. 2A, the display panel 100 has a display area AA (also called active area) and a peripheral area BB located on at least one side of the display area AA. In FIG. 2A, the peripheral area BB is arranged around the display area AA for illustration.

The display panel 100 includes sub-pixels P of a plurality of colors disposed in the display area AA. The sub-pixels P of the plurality of colors at least include sub-pixels of a first color, sub-pixels of a second color and sub-pixels of a third color. The first color, the second color and the third color may be three primary colors (e.g., red, green and blue, respectively).

For the convenience of description, as an example, the sub-pixels P are arranged in a matrix. In this case, sub-pixels P arranged in a line in a horizontal direction X are referred to as sub-pixels in a row, and sub-pixels P arranged in a line in a vertical direction Y are referred to as sub-pixels in a column.

Figure 3:
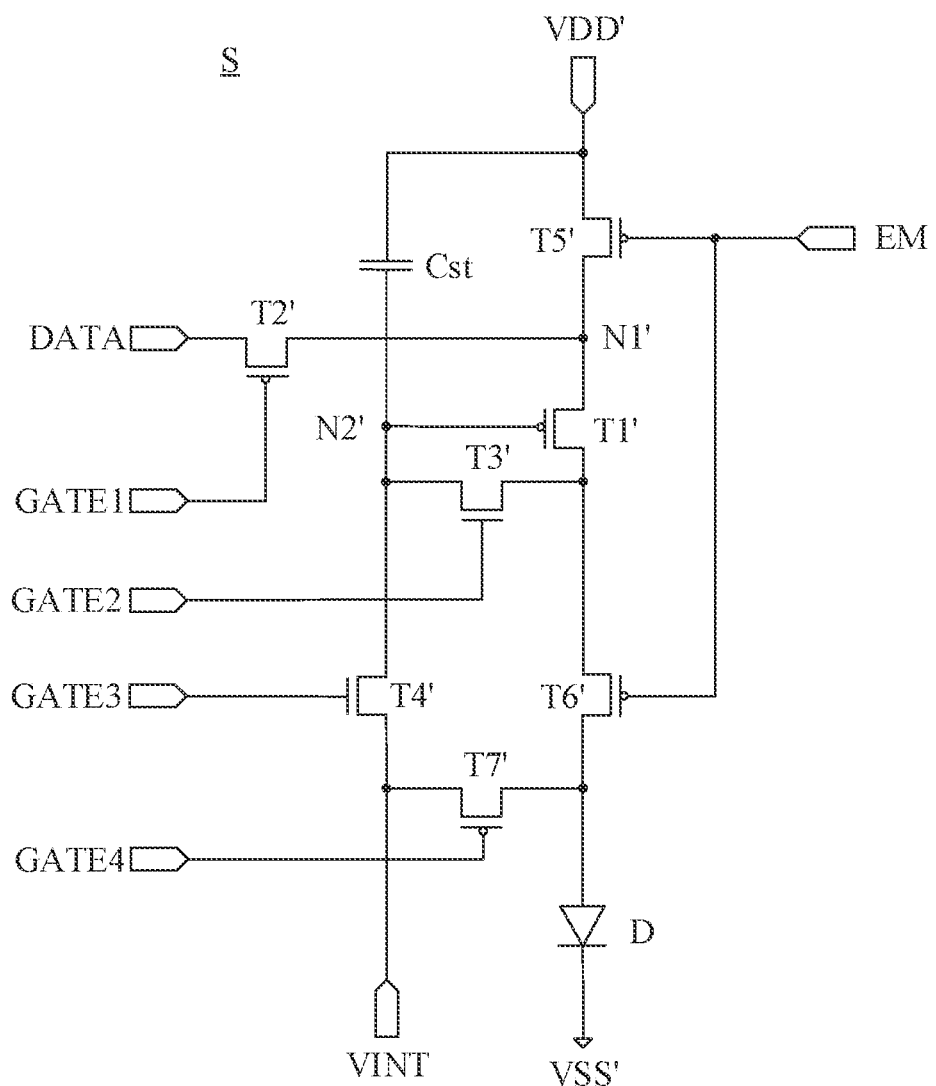
FIG. 3 is a circuit diagram of a pixel driving circuit, in accordance with some embodiments of the present disclosure.

As shown in FIG. 3, each sub-pixel P is provided with a pixel driving circuit S. The pixel driving circuit S includes a first transistor T1', a second transistor T2', a third transistor T3', a fourth transistor T4', a fifth transistor T5', a sixth transistor T6', a seventh transistor T7' and a capacitor Cst.

A control electrode of the first transistor T1' is coupled to a second node N2', and a first electrode of the first transistor T1' is coupled to a first node N1'. A control electrode of the second transistor T2' is coupled to a first scan signal terminal GATE1, a first electrode of the second transistor T2' is coupled to a data signal terminal DATA, and a second electrode of the second transistor T2' is coupled to the first node N1'. A control electrode of the third transistor T3' is coupled to a second scan signal terminal GATE2, a first electrode of the third transistor T3' is coupled to the second node N2', and a second electrode of the third transistor T3' is coupled to a second electrode of the first transistor T1'. A control electrode of the fourth transistor T4' is coupled to a third scan signal terminal GATE3, a first electrode of the fourth transistor T4' is coupled to an initial signal terminal VINT, and a second electrode of the fourth transistor T4' is coupled to the second node N2'. A control electrode of the fifth transistor T5' is coupled to a light-emitting control signal terminal EM, a first electrode of the fifth transistor T5' is coupled to a first voltage signal terminal VDD', and a second electrode of the fifth transistor T5' is coupled to the first node N1'. A control electrode of the sixth transistor T6' is coupled to the light-emitting control signal terminal EM, and a first electrode of the sixth transistor T6' is coupled to the second electrode of the first transistor T1'. A control electrode of the seventh transistor T7' is coupled to a fourth scan signal terminal GATE4, a first electrode of the seventh transistor T7' is coupled to the initial signal terminal VINT, and a second electrode of the seventh transistor T7' is coupled to a second electrode of the sixth transistor T6'. A first terminal of the capacitor Cst is coupled to the first voltage signal terminal VDD', and a second terminal of the capacitor Cst is coupled to the second node N2'.

The sub-pixel P further includes a light-emitting device D. A first electrode of the light-emitting device D is coupled to the second electrode of the sixth transistor T6', and a second electrode of the light-emitting device D is coupled to a second voltage signal terminal VSS'. Pixel driving circuits S in a same row are coupled to a same control signal line L, and pixel driving circuits S in a same column are coupled to a same data line DL, so as to drive the light-emitting devices D in the sub-pixels P to emit light.

It will be noted that the pixel driving circuit S is not limited to be of the circuit structure shown in FIG. 3, and may be of other circuit structures, which will not be listed here.

The transistors included in the pixel driving circuit S may be N-type transistors or P-type transistors, or may include both of the N-type transistor(s) and the P-type transistor(s), which may be designed according to actual requirements. In addition, the transistors included in the pixel driving circuit S may be low temperature poly-silicon (LTPS) transistors or oxide transistors, or may include both of the low temperature poly-silicon transistor(s) and the oxide transistor(s).

Since a voltage for controlling a brightness of the sub-pixel varies over time due to an electric leakage of the transistor in the pixel driving circuit S, in order to ensure that a brightness of a pixel fluctuates within a reasonable range, a data signal is still required to be refreshed when a still image is displayed. In order to reduce the power consumption when the still image is displayed, it is effective to reduce a refresh frequency. Moreover, a leakage speed of the transistor in the pixel driving circuit S is required to be reduced to maintain the display quality.

In order to solve the above problem, in some embodiments, the transistors (e.g., the first transistor T1', the fifth transistor T5' and the sixth transistor T6' in FIG. 3) for driving in the pixel driving circuit S may be set as the oxide transistors by using a low temperature polycrystalline oxide (LTPO) process in combination with excellent characteristics of low temperature poly-silicon and oxide, and the electric leakage of the transistor may be improved by making use of the ultra-low leakage characteristic of an oxide semiconductor. The transistors (e.g., the second transistor T2', the third transistor T3', the fourth transistor T4' and the seventh transistor T7') for switching in the pixel driving circuit S may be set as the low temperature poly-silicon transistors, so as to ensure a charging speed of the sub-pixel P and a small parasitic capacitance.

Referring to FIG. 2A, at least one gate driving circuit G and a data driving circuit DD are provided in the peripheral area BB of the display panel 100. In some embodiments, the gate driving circuit G may be provided on a side of the control signal lines L in an extending direction of the control signal lines L, and the data driving circuit DD may be provided on a side of the data lines DL in an extending direction of the data lines DL, so as to drive the pixel driving circuits S in the display panel 100, thereby driving the light-emitting devices to emit light to make the display panel 100 display.

For example, the gate driving circuit G may be a gate driving circuit for transmitting a light-emitting control signal Em to the pixel driving circuits S, or a gate driving circuit for transmitting a scan signal Gate to the pixel driving circuits S.

For example, as shown in FIG. 2A, a first gate driving circuit 01, a second gate driving circuit 02 and a third gate driving circuit 03 are provided in the peripheral area BB of the display panel 100. In combination with FIG. 3, the first gate driving circuit 01 is configured to transmit the light-emitting control signal Em to the light-emitting control signal terminal EM of the pixel driving circuit S. The second gate driving circuit 02 is configured to transmit a second scan signal Gate2 to the second scan signal terminal GATE2 of the pixel driving circuit S, and to transmit a third scan signal Gate3 to the third scan signal terminal GATE3. The third gate driving circuit 03 is configured to transmit a first scan signal Gate1 to the first scan signal terminal GATE1 of the pixel driving circuit S, and to transmit a fourth scan signal Gate4 to the fourth scan signal terminal GATE4.

The number of the gate driving circuit(s) G included in the display panel 100 may be determined according to specific situations, and the above is only an example.

In some embodiments, the gate driving circuit G may be a gate driver on array (GOA) circuit. That is, the gate driving circuit G is directly integrated on an array substrate in the display panel 100. A description will be made in an example where the gate driving circuit G is the GOA circuit in following embodiments.

It will be noted that FIG. 2A is only a schematic diagram in which the gate driving circuits G are provided on a side of the control signal lines L in the peripheral area BB of the display panel 100, and the control signal lines L are sequentially driven from the side, i.e., are driven in a single-sided manner as an example. In some other embodiments, two gate driving circuits G are respectively provided on two sides of the control signal lines L in the extending direction of the control signal lines L in the peripheral area BB of the display panel 100. The control signal lines L are sequentially driven from the two sides through the two gate driving circuits G, i.e., are driven in a double-sided manner. In yet other embodiments, two gate driving circuits G are provided on the two sides of the control signal lines L in the extending direction of the control signal lines L in the peripheral area BB of the display panel 100, respectively. The control signal lines L are sequentially driven alternately from the two sides through the two gate driving circuits G, i.e., are driven in an alternating manner. Considering the single-sided driving manner as an example, a description will be made in following embodiments of the present disclosure.

In some embodiments of the present disclosure, the gate driving circuit G includes a plurality of shift register circuits that are sequentially cascaded, and each stage of shift register circuit is coupled to at least one control signal line L.

For example, as shown in FIG. 2A, N stages of shift register circuits (RS1, RS2 . . . RS(N)) are coupled to N control signal lines (L1, L2 . . . L(N)) in one-to-one correspondence. Each stage of shift register circuit is coupled to a control signal line L, and each control signal line L is coupled to sub-pixels P in a row. That is, each stage of shift register circuit drives sub-pixels P in a row. Here, N is a positive integer. In some other embodiments, each control signal line L may be coupled to sub-pixels P in two adjacent rows. That is, except for a first stage shift register circuit and a last stage shift register circuit, each stage of shift register circuit may drive sub-pixels P in two adjacent rows.

For example, as shown in FIG. 2A, in a case where the second gate driving circuit 02 is located between the first gate driving circuit 01 and the third gate driving circuit 03 in the extending direction of the control signal lines L, in the second gate driving circuit 02, except for a first stage shift register circuit and a last stage shift register circuit, each stage of shift register circuit drives sub-pixels P in two adjacent rows. Moreover, in the third gate driving circuit 03, except for a first stage shift register circuit and a last stage shift register circuit, each stage of shift register circuit drives sub-pixels P in two adjacent rows.

For another example, in a case where the third gate driving circuit 03 is located between the first gate driving circuit 01 and the second gate driving circuit 02 in the extending direction of the control signal lines L, each stage of shift register circuit in the second gate driving circuit 02 drives sub-pixels P in a row, and each stage of shift register circuit in the third gate driving circuit 03 drives sub-pixels P in a row.

Figure 2B:
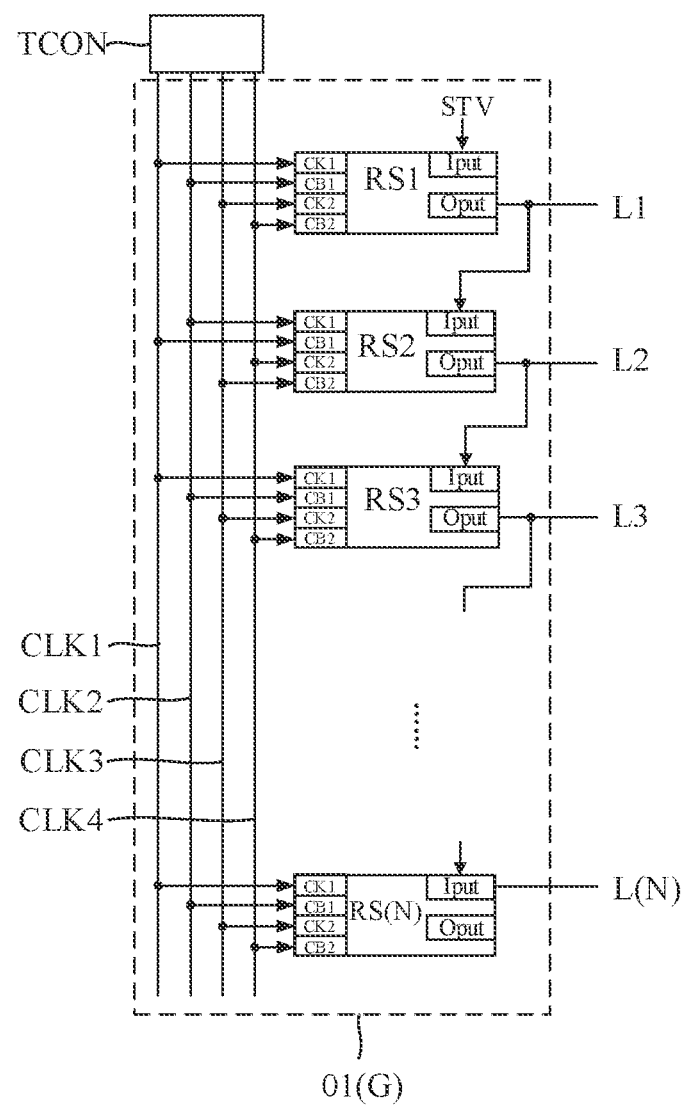
FIG. 2B is a structural diagram of another display panel, in accordance with some embodiments of the present disclosure.

In some embodiments, as shown in FIG. 2B, each of the shift register circuits (RS1, RS2 . . . RS(N)) in the gate driving circuit G is provided with a signal output terminal Output (i.e., Oput in the following and in the figures), and outputs the scan signal to the control signal line(s) L coupled thereto through the signal output terminal Oput.

In addition, in some embodiments, as shown in FIG. 2B, each of the shift register circuits (RS1, RS2 . . . RS(N)) in the gate driving circuit G is further provided with a signal input terminal Input (i.e., Iput in the following and in the figures), and the shift register circuits in the gate driving circuit G have a same circuit structure.

On this basis, a cascaded structure of the shift register circuits in the gate driving circuit G may be as follows.

The signal input terminal Iput of the first stage shift register circuit RS1 is connected to an initial signal terminal STV. Except for the first stage shift register circuit RS1, the signal input terminal Iput of any other shift register circuit is connected to the signal output terminal Oput of a previous shift register circuit.

In some embodiments, as shown in FIG. 2B, each of the shift register circuits (RS1, RS2 . . . RS(N)) in the gate driving circuit G is further provided with a first clock signal terminal CK1, a second clock signal terminal CB1, a third clock signal terminal CK2 and a fourth clock signal terminal CB2, which are respectively coupled to signal lines to respectively receive voltage signals transmitted by the signal lines.

In the related art, a display device operates in a low-frequency mode, and a gate driving circuit in the display device is driven in a clock holding manner, so as to ensure that a control signal output from the gate driving circuit has an active potential when the display device displays a screen. However, a required clock signal driven in the clock holding manner is an alternating current voltage signal switched between high and low levels, which results in large power consumption of the display device. Moreover, due to an electric leakage of a transistor in the gate driving circuit, an active potential of a scan signal output from the gate driving circuit is also affected.

Figure 4:
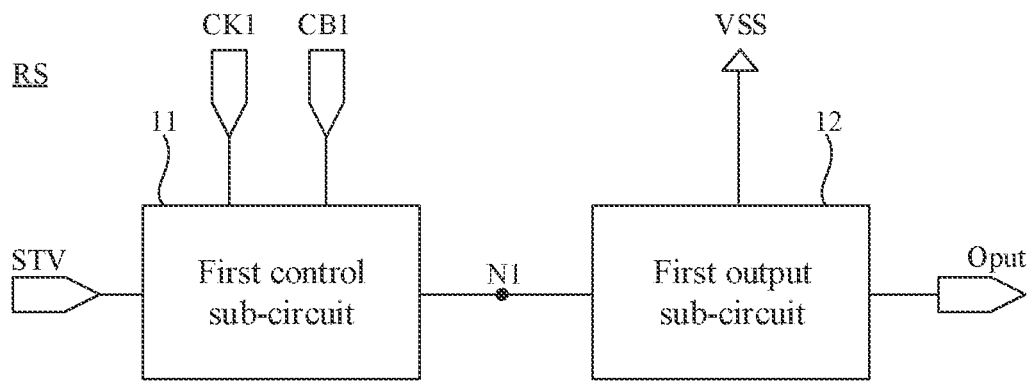
FIG. 4 is a structural diagram of a shift register circuit, in accordance with some embodiments of the present disclosure.
Figure 5:
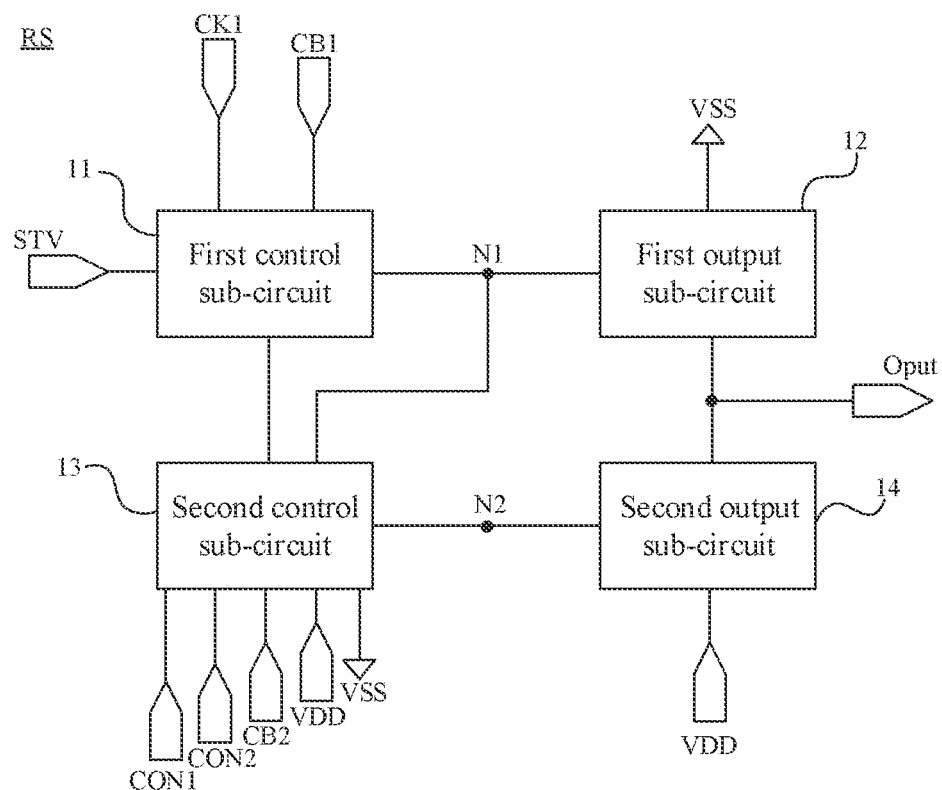
FIG. 5 is a structural diagram of another shift register circuit, in accordance with some embodiments of the present disclosure.

In order to solve the above problems, as shown in FIG. 4, some embodiments of the present disclosure further provide the shift register circuit RS including a first control sub-circuit 11 and a first output sub-circuit 12.

The first control sub-circuit 11 is coupled to the first clock signal terminal CK1, the second clock signal terminal CB1, the initial signal terminal STV and a first node N1. The first control sub-circuit 11 is configured to: adjust a voltage of the first node N1 to a turn-on voltage due to an influence of a first direct current voltage signal from the first clock signal terminal CK1, an initial voltage signal from the initial signal terminal STV and a second direct current voltage signal from the second clock signal terminal CB1; and maintain the voltage of the first node N1 at the turn-on voltage due to an influence of a first clock signal from the first clock signal terminal CK1 and a second clock signal from the second clock signal terminal CB1.

It can be understood that "adjusting the voltage of the first node N1 to the turn-on voltage" means that the voltage of the first node N1 is changed from being not equal to the turn-on voltage to being equal to the turn-on voltage. "Maintaining the voltage of the first node N1 at the turn-on voltage" means that the voltage of the first node N1 is maintained at the turn-on voltage, and the voltage of the first node N1 is unchanged.

Figure 12:
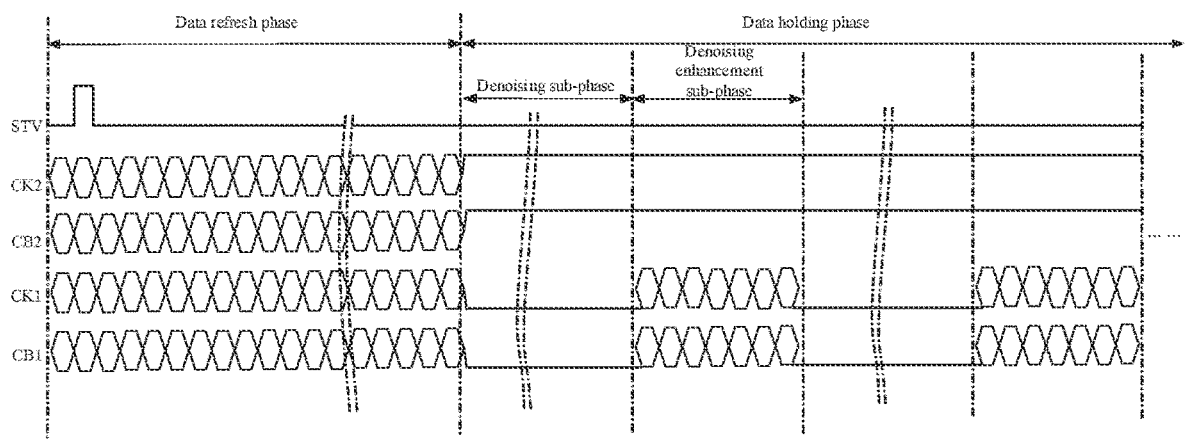
FIG. 12 is a timing diagram of a driving method of a shift register circuit, in accordance with some embodiments of the present disclosure.

It will be noted that as shown in FIG. 12, a frame period includes a data holding phase, and the data holding phase includes a plurality of denoising sub-phases and a plurality of denoising enhancement sub-phases. The denoising sub-phases and the denoising enhancement sub-phases are alternated.

The first clock signal terminal CK1 is configured to output the first direct current voltage signal in the denoising sub-phase, and to output the first clock signal in the denoising enhancement sub-phase. The second clock signal terminal CB1 is configured to output the second direct current voltage signal in the denoising sub-phase, and to output the second clock signal in the denoising enhancement sub-phase. Moreover, the first direct current voltage signal and the second direct current voltage signal may be low level signals, and the first clock signal and the second clock signal are substantially mutually inverted signals.

The first control sub-circuit 11 is configured to: adjust the voltage of the first node N1 to the turn-on voltage due to the influence of the first direct current voltage signal, the initial voltage signal and the second direct current voltage signal in the denoising sub-phase; and maintain the voltage of the first node N1 at the turn-on voltage due to the influence of the first clock signal and the second clock signal in the denoising enhancement sub-phase.

As shown in FIG. 4, the first output sub-circuit 12 is coupled to the first node N1, a first voltage terminal VSS and the signal output terminal Oput. The first output sub-circuit 12 is configured to be turned on under a control of the turn-on voltage of the first node N1 to transmit a first voltage signal from the first voltage terminal VSS to the signal output terminal Oput.

It will be noted that the first voltage terminal VSS is configured to transmit a direct current level signal. That is, the first voltage signal is the direct current level signal. The first voltage terminal VSS may be coupled to a VSS line for transmitting the first voltage signal in the display device 200 to receive the first voltage signal. The first voltage signal may be a direct current low level signal or a direct current high level signal.

It can be understood that the voltage of the first node N1 controls the first output sub-circuit 12 to be turned on or off. In a case where the voltage of the first node N1 is able to control the first output sub-circuit 12 to be turned on, the voltage of the first node N1 is the turn-on voltage.

Moreover, the first output sub-circuit 12 is configured to be turned on under the control of the turn-on voltage of the first node N1 in the data holding phase to transmit the first voltage signal from the first voltage terminal VSS to the signal output terminal Oput. The first voltage signal output from the signal output terminal Oput is the scan signal for driving the pixel driving circuits S in the display panel 100, thereby driving the light-emitting devices to emit light to make the display panel 100 display.

It can be seen from the above that the first voltage signal is the direct current low level signal or the direct current high level signal, depending on whether an active potential of the scan signal is at a low level or a high level.

In the shift register circuit RS in the above embodiments of the present disclosure, in the denoising sub-phase, the first control sub-circuit 11 receives the first direct current voltage signal from the first clock signal terminal CK1, the initial voltage signal from the initial signal terminal STV and the second direct current voltage signal from the second clock signal terminal CB1, and adjusts the voltage of the first node N1 to the turn-on voltage due to the influence of the first direct current voltage signal, the initial voltage signal and the second direct current voltage signal, so as to control the first output sub-circuit 12 to be turned on and output the scan signal. Since the power consumption of the display device 200 for generating a direct current voltage signal is less than the power consumption of the display device 200 for generating an alternating current voltage signal, compared to the alternating current voltage signal, the first direct current voltage signal and the second direct current voltage signal are used in the first control sub-circuit 11, and the first direct current voltage signal and the second direct current voltage signal are the low level signals, which may reduce the power consumption of the display device 200.

Moreover, in the denoising enhancement sub-phase, the first control sub-circuit 11 maintains the voltage of the first node N1 at the turn-on voltage due to the influence of the first clock signal from the first clock signal terminal CK1 and the second clock signal from the second clock signal terminal CB1, which may avoid a change of the voltage of the first node N1 due to the electric leakage of the transistor in the shift register circuit RS, thereby ensuring that the first output sub-circuit 12 is turned on stably.

On this basis, in some embodiments, as shown in FIGS. 5 to 11, the shift register circuit RS further includes a second control sub-circuit 13 and a second output sub-circuit 14.

The second control sub-circuit 13 is coupled to the first node N1, the first voltage terminal VSS, a first control signal terminal CON1, a second control signal terminal CON2, the fourth clock signal terminal CB2, a second voltage terminal VDD, a second node N2 and the first control sub-circuit 11. The second control sub-circuit 13 is configured to, under a control of a first control signal from the first control signal terminal CON1 and a second control signal from the second control signal terminal CON2, and due to an influence of the first voltage signal from the first voltage terminal VSS and a fourth clock signal from the fourth clock signal terminal CB2, adjust a voltage of the second node N2 to a turn-on voltage.

It will be noted that the first control signal terminal CON1 is one of the first clock signal terminal CK1 or the third clock signal terminal CK2, and the second control signal terminal CON2 is one of the second clock signal terminal CB1 or the fourth clock signal terminal CB2.

As shown in FIG. 12, the frame period further includes a data refresh phase S preceding the data holding phase. The first clock signal terminal CK1 is configured to output the first clock signal in the data refresh phase S. The second clock signal terminal CB1 is configured to output the second clock signal in the data refresh phase S. The third clock signal terminal CK2 is configured to output a third clock signal in the data refresh phase S, and to output a third direct current voltage signal in the data holding phase. The fourth clock signal terminal CB2 is configured to output the fourth clock signal in the data refresh phase S, and to output a fourth direct current voltage signal in the data holding phase. The third direct current voltage signal and the fourth direct current voltage signal are high level signals.

Figure 7:
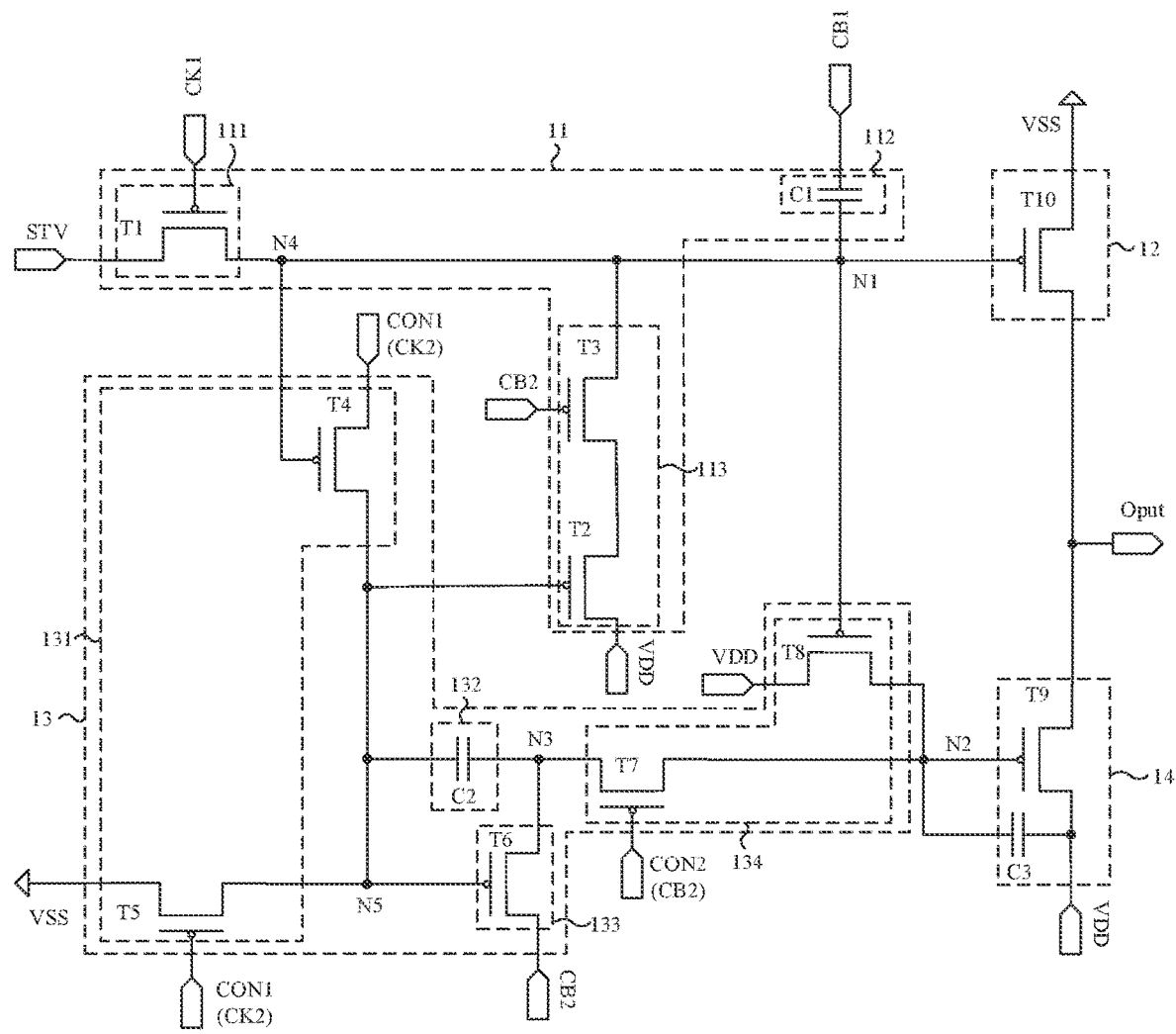
FIG. 7 is a circuit diagram of a shift register circuit, in accordance with some embodiments of the present disclosure.

For example, FIG. 7 shows a case that the first control signal terminal CON1 is the third clock signal terminal CK2 and the second control signal terminal CON2 is the fourth clock signal terminal CB2. That is, the second control sub-circuit 13 is coupled to the first node N1, the first voltage terminal VSS, the third clock signal terminal CK2, the fourth clock signal terminal CB2, the second voltage terminal VDD, the second node N2 and the first control sub-circuit 11. The second control sub-circuit 13 is configured to, under a control of the third clock signal from the third clock signal terminal CK2 and the fourth clock signal from the fourth clock signal terminal CB2, and due to the influence of the first voltage signal from the first voltage terminal VSS and the fourth clock signal from the fourth clock signal terminal CB2, adjust the voltage of the second node N2 to the turn-on voltage.

Figure 8:
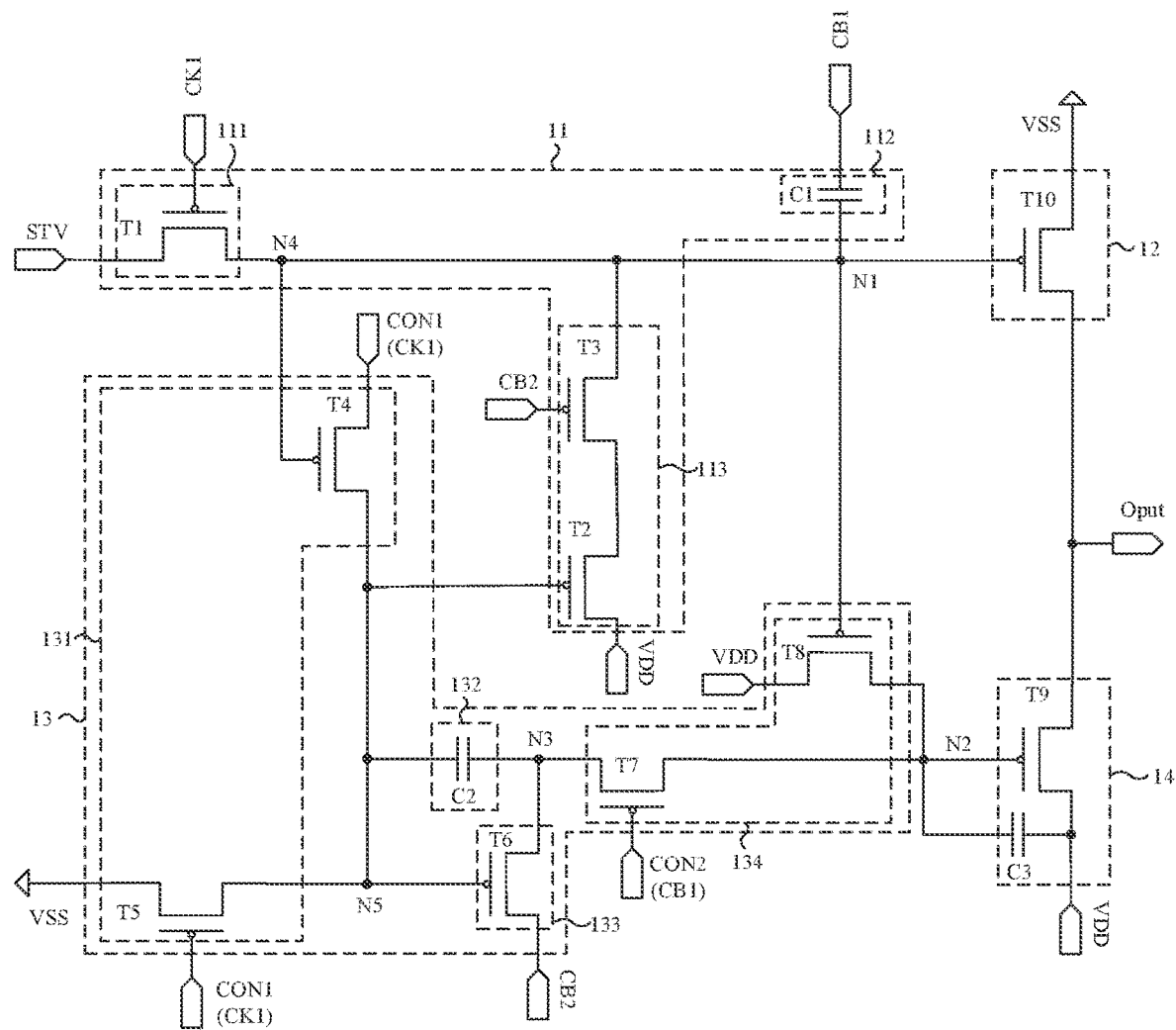
FIG. 8 is a circuit diagram of another shift register circuit, in accordance with some embodiments of the present disclosure.

For example, FIG. 8 shows a case that the first control signal terminal CON1 is the first clock signal terminal CK1 and the second control signal terminal CON2 is the second clock signal terminal CB1. That is, the second control sub-circuit 13 is coupled to the first node N1, the first voltage terminal VSS, the first clock signal terminal CK1, the second clock signal terminal CB1, the fourth clock signal terminal CB2, the second voltage terminal VDD, the second node N2 and the first control sub-circuit 11. The second control sub-circuit 13 is configured to, under a control of the first clock signal from the first clock signal terminal CK1 and the second clock signal from the second clock signal terminal CB1, and due to the influence of the first voltage signal from the first voltage terminal VSS and the fourth clock signal from the fourth clock signal terminal CB2, adjust the voltage of the second node N2 to the turn-on voltage.

As shown in FIGS. 5 to 11, the second output sub-circuit 14 is coupled to the second node N2, the second voltage terminal VDD and the signal output terminal Oput. The second output sub-circuit 14 is configured to be turned on under a control of the turn-on voltage of the second node N2, and transmit the second voltage signal from the second voltage terminal VDD to the signal output terminal Oput.

It will be noted that the second voltage terminal VDD is configured to transmit a direct current level signal. That is, the second voltage signal is the direct current level signal. The second voltage terminal VDD may be coupled to a VDD line for transmitting the second voltage signal in the display device 200 to receive the second voltage signal. The second voltage signal may be a direct current high level signal or a direct current low level signal.

It can be understood that the voltage of the second node N2 controls the second output sub-circuit 14 to be turned on or off. In a case where the voltage of the second node N2 is able to control the second output sub-circuit 14 to be turned on, the voltage of the second node N2 is the turn-on voltage.

It will be noted that the second output sub-circuit 14 is configured to be turned off under a control of the voltage of the second node N2 in the data holding phase, and to be turned on under the control of the turn-on voltage of the second node N2 in the data refresh phase S. The second voltage signal from the second voltage terminal VDD is output from the signal output terminal Oput, and the second voltage signal is used for driving the pixel driving circuits S in the display panel 100 to be turned off, thereby driving the light-emitting devices to stop emitting light to make the display panel 100 stop displaying.

It can be seen from the above that the second voltage signal is the direct current high level signal or the direct current low level signal, depending on whether an active potential for driving the pixel driving circuits S to be turned off is at a high level or a low level.

On this basis, specific structures of the first control sub-circuit 11 and the second control sub-circuit 13 will be sequentially described below.

Figure 6:
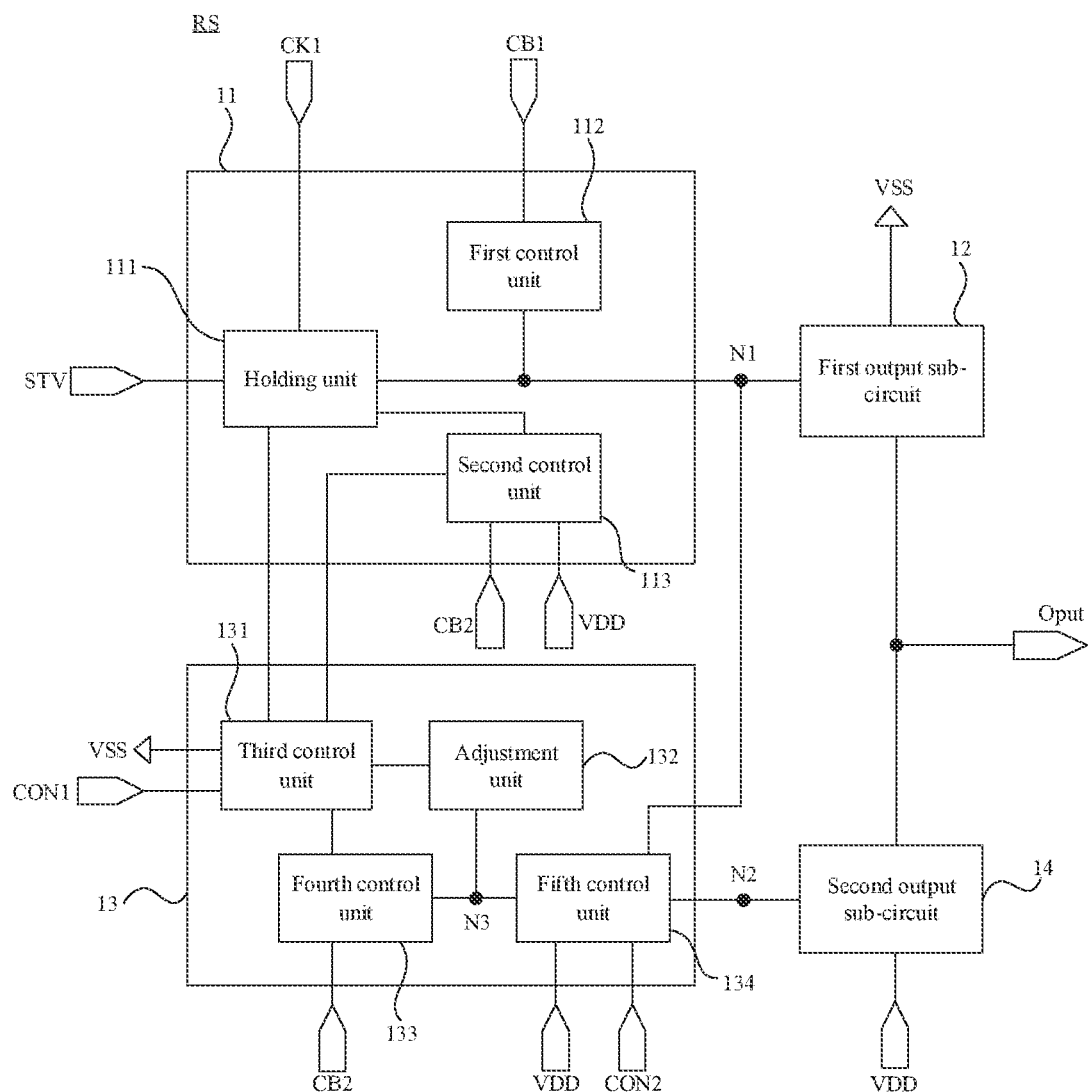
FIG. 6 is a structural diagram of yet another shift register circuit, in accordance with some embodiments of the present disclosure.

In some embodiments, as shown in FIG. 6, the first control sub-circuit 11 includes a holding unit 111 and a first control unit 112.

The holding unit 111 is coupled to the first clock signal terminal CK1, the first node N1 and the initial signal terminal STV. The holding unit 111 is configured to be turned off due to an influence of the first direct current voltage signal from the first clock signal terminal CK1 and the initial voltage signal from the initial signal terminal STV, and to be turned on under a control of the first clock signal from the first clock signal terminal CK1 and due to an influence of the second clock signal from the second clock signal terminal to maintain the voltage of the first node N1 at the turn-on voltage.

The first control unit 112 is coupled to the second clock signal terminal CB1 and the first node N1. The first control unit 112 is configured to: adjust the voltage of the first node N1 to the turn-on voltage due to an influence of the second direct current voltage signal from the second clock signal terminal CB1: and adjust the voltage of the first node N1 due to an influence of the second clock signal from the second clock signal terminal CB1.

It will be noted that the holding unit 111 is configured to be turned off due to the influence of the first direct current voltage signal and the initial voltage signal in the denoising sub-phase. Moreover, the first control unit 112 is configured to adjust the voltage of the first node N1 to the turn-on voltage due to the influence of the second direct current voltage signal, so as to control the first output sub-circuit 12 to be turned on in the denoising sub-phase.

The first control unit 112 is configured to adjust the voltage of the first node N1 due to the influence of the second clock signal in the denoising enhancement sub-phase. Moreover, the holding unit 111 is configured to be turned on under the control of the first clock signal and due to the influence of the second clock signal to maintain the voltage of the first node N1 at the turn-on voltage, thereby keeping the first output sub-circuit 12 turned on in the denoising enhancement sub-phase.

In summary, the first control sub-circuit 11 includes the holding unit 111 and the first control unit 112, which may ensure that the first output sub-circuit 12 is stably turned on in the data holding phase.

In some embodiments, as shown in FIGS. 7 and 8, the holding unit 111 includes a first transistor T1. A control electrode of the first transistor T1 is coupled to the first clock signal terminal CK1, a first electrode of the first transistor T1 is coupled to the initial signal terminal STV, and a second electrode of the first transistor T1 is coupled to the first node N1 (or a fourth node N4). The first transistor T1 is configured to be turned off due to the influence of the first direct current voltage signal and the initial voltage signal in the denoising sub-phase, and to be turned on under the control of the first clock signal and due to the influence of the second clock signal in the denoising enhancement sub-phase to maintain the voltage of the first node N1 at the turn-on voltage.

As shown in FIGS. 7 and 8, the first control unit 112 includes a first capacitor C1. A first terminal of the first capacitor C1 is coupled to the second clock signal terminal CB1, and a second terminal of the first capacitor C1 is coupled to the first node N1. The first capacitor C1 is configured to: adjust the voltage of the first node N1 to the turn-on voltage due to an action of the second direct current voltage signal according to a bootstrap action of the first capacitor in the denoising sub-phase; and adjust the voltage of the first node N1 due to an action of the second clock signal in the denoising enhancement sub-phase.

For example, in an example where the first transistor T1 is of P-type, in combination with FIG. 12, in the denoising sub-phase, the first direct current voltage signal received at the first clock signal terminal CK1 is a low level signal, the second direct current voltage signal received at the second clock signal terminal CB1 is a low level signal, and the initial voltage signal received at the initial signal terminal STV is a low level signal. A voltage of the first direct current voltage signal is the same as a voltage of the initial voltage signal.

A threshold voltage $V_{th}$ of a transistor of P-type is negative. Moreover, a conduction condition of the transistor of P-type is that a gate-source voltage difference $V_{gs}$s (i.e., a voltage difference between a control electrode and a first electrode of the transistor, or a voltage difference between the control electrode and a second electrode of the transistor) of the transistor is less than the threshold voltage $V_{th}$ of the transistor, i.e., $V_{gs}<V_{th}<0$. Therefore, in the denoising sub-phase, a gate-source voltage difference $V_{gs}$ (a voltage difference between the control electrode and the first electrode of the first transistor T1) of the first transistor T1 is equal to 0 (i.e., $V_{gs}=0$), and the first transistor T1 is turned off.

The first capacitor C1 is configured to adjust the voltage of the first node N1 to the turn-on voltage due to the action of the second direct current voltage signal according to the bootstrap action of the first capacitor in the denoising sub-phase, so that the turn-on voltage and a voltage of the second direct current voltage signal are substantially equal to each other, and are at a low level. In this case, the first output sub-circuit 12 is turned on under a control of a low level voltage of the first node N1.

It can be seen from the foregoing that the electric leakage of the transistor exists in the shift register circuit RS. For example, in a case where the turn-on voltage of the first node N1 is at a low level, the voltage of the first node N1 is increased due to an electric leakage of the first transistor T1, so that the first output sub-circuit 12 controlled by the voltage of the first node N1 is turned off, or cannot be turned on completely.

In order to avoid the above problem, for example, in the example where the first transistor T1 is of P-type, in combination with FIG. 12, in the denoising enhancement sub-phase, the first clock signal received at the first clock signal terminal CK1 is a low level signal, and the second clock signal received at the second clock signal terminal CB1 is a high level signal.

The first capacitor C1 is configured to pull the voltage of the first node N1 high due to the action of the second clock signal in the denoising enhancement sub-phase, so that a gate-source voltage difference $V_{gs}$ (a voltage difference between the control electrode and the second electrode of the first transistor T1) of the first transistor T1 is less than $V_{th}$, and $V_{th}$ is less than 0 (i.e., $V_{gs} < V_{th} < 0$), and the first transistor T1 is turned on. As a result, charges of the first node N1 are rectified to the initial signal terminal STV through the first transistor T1 to pull down the voltage of the first node N1, so as to maintain the voltage of the first node N1 at the turn-on voltage, thereby ensuring that the first output sub-circuit 12 is turned on stably.

Figure 9:
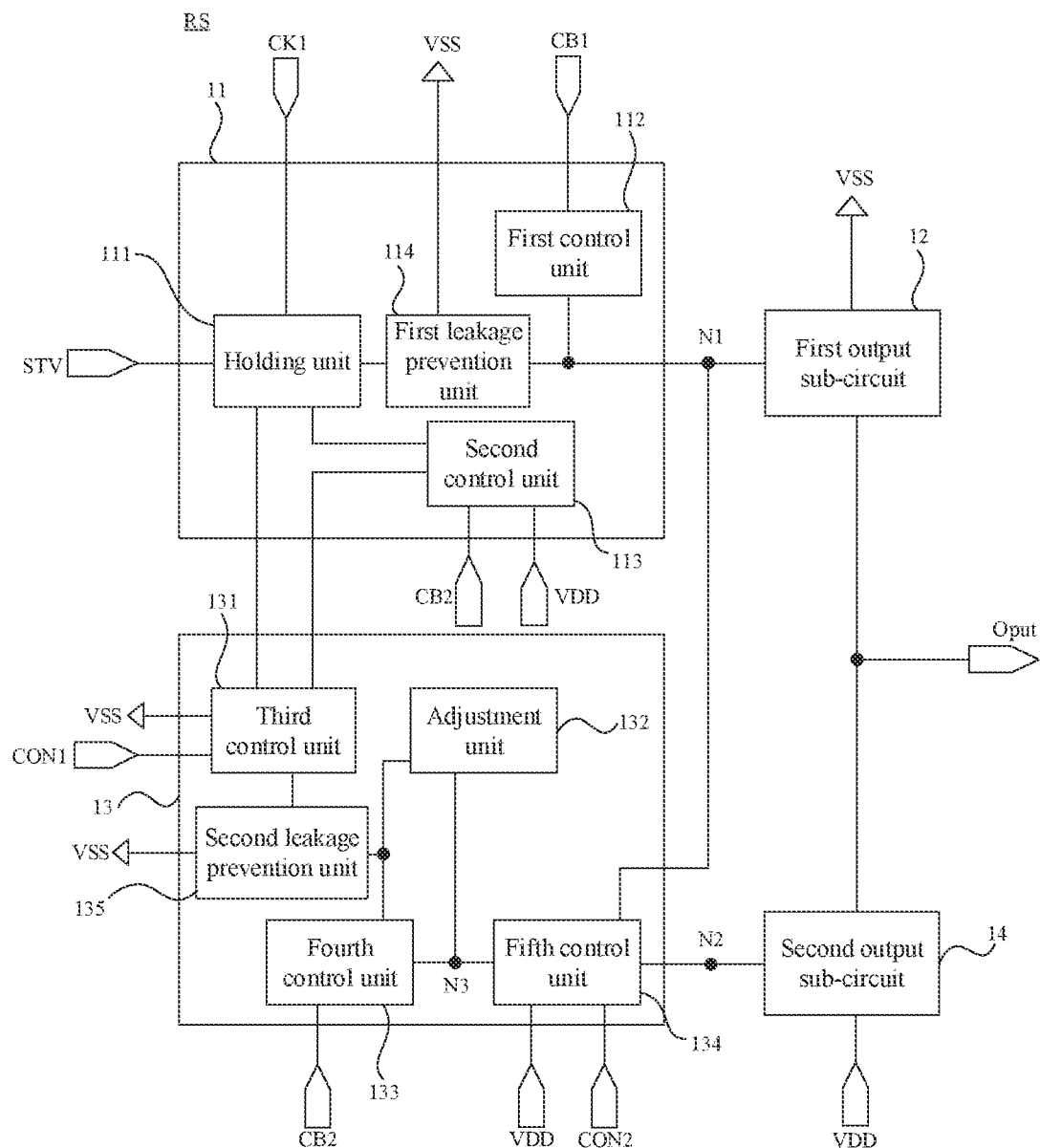
FIG. 9 is a structural diagram of yet another shift register circuit, in accordance with some embodiments of the present disclosure.

In order to further improve a stability of the voltage of the first node N1, so as to ensure that the first output sub-circuit 12 is turned on stably, in some embodiments, as shown in FIG. 9, the first control sub-circuit 11 further includes a first anti-leakage unit 114. The first anti-leakage unit 114 is coupled to the first voltage terminal VSS, and the holding unit 111 is coupled to the first node N1 through the first anti-leakage unit 114. The first anti-leakage unit 114 is configured to maintain the turn-on voltage of the first node N1 under a control of the first voltage signal from the first voltage terminal VSS and due to an influence of the turn-on voltage of the first node N1.

It can be understood that the holding unit 111 is coupled to the first node N1 through the first anti-leakage unit 114, and the first anti-leakage unit 114 may be used for disconnecting the holding unit 111 from the first node N1, so as to avoid the change of the voltage of the first node N1 due to the electric leakage of the first transistor T1 in the holding unit 111, thereby maintaining the voltage of the first node N1.

Figure 10:
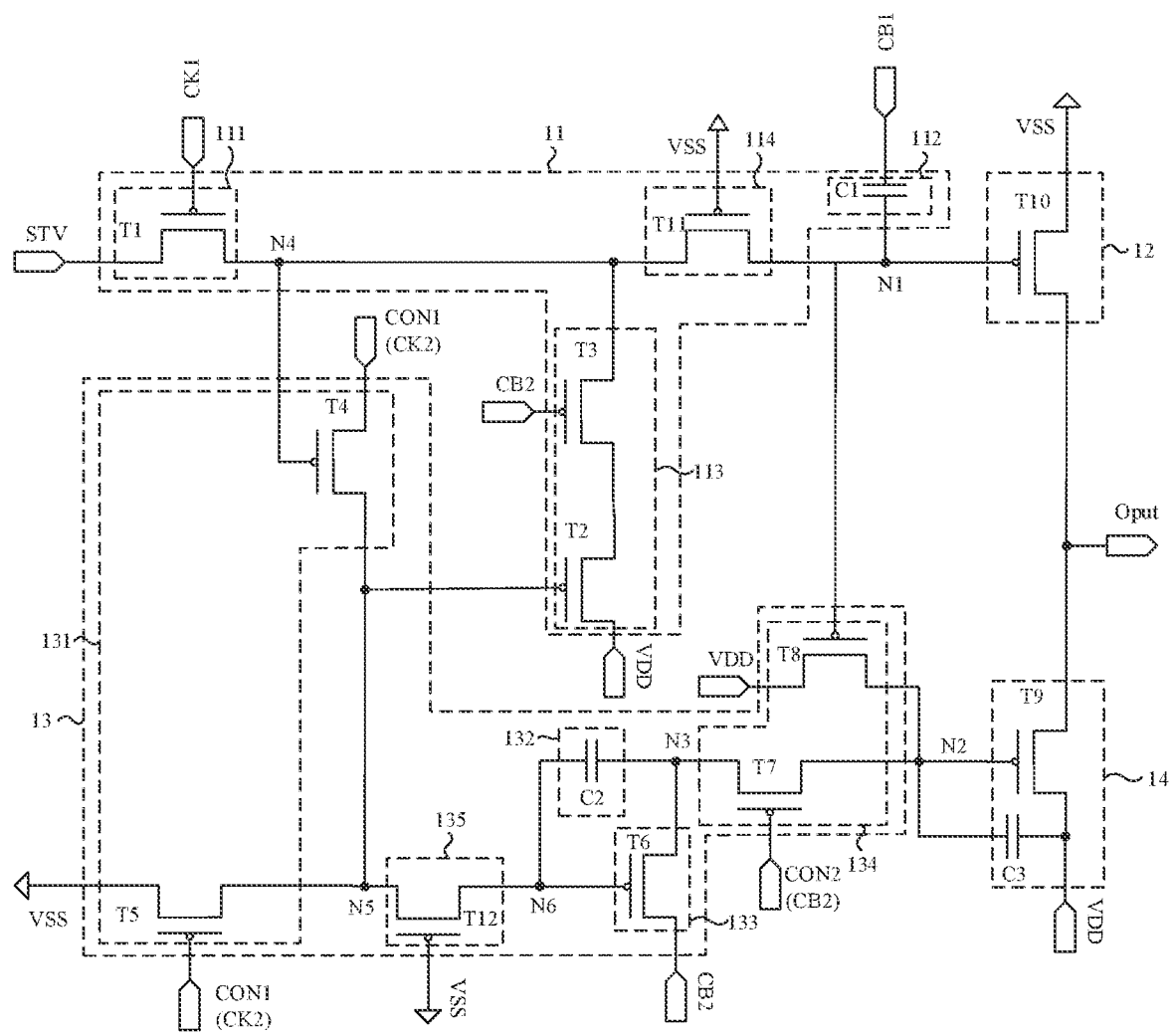
FIG. 10 is a circuit diagram of yet another shift register circuit, in accordance with some embodiments of the present disclosure.

In some embodiments, as shown in FIG. 10, the first anti-leakage unit 114 includes an eleventh transistor T11. A control electrode of the eleventh transistor T11 is coupled to the first voltage terminal VSS, a first electrode of the eleventh transistor T11 is coupled to the first node N1, and a second electrode of the eleventh transistor T11 is coupled to the holding unit 111 (or the fourth node N4). The eleventh transistor T11 is configured to be turned off under the control of the first voltage signal and due to the influence of the turn-on voltage of the first node N1 in the denoising sub-phase, so as to disconnect the first node N1 from the first transistor T1.

For example, in an example where the eleventh transistor T11 is of P-type, the first voltage signal received at the first voltage terminal VSS is a direct current low level signal, the turn-on voltage of the first node N1 is at a low level, and a voltage of the first voltage signal and the turn-on voltage are substantially equal to each other. In this case, in the denoising sub-phase, a gate-source voltage difference $V_{gs}$ (a voltage difference between the control electrode and the first electrode of the eleventh transistor T11) of the eleventh transistor T11 is equal to 0 (i.e., $V_{gs}=0$), and the eleventh transistor T11 is turned off, so as to disconnect the first node N1 from the first transistor T1.

In some embodiments, as shown in FIG. 6, the first control sub-circuit 11 further includes a second control unit 113, and the second control unit 113 is coupled to the holding unit 111, the second control sub-circuit 13, the fourth clock signal terminal CB2 and the second voltage terminal VDD. The second control unit 113 is configured to: transmit the second voltage signal from the second voltage terminal VDD to the holding unit 111 under a control of the fourth clock signal from the fourth clock signal terminal CB2 and the second control sub-circuit 13.

Figure 14:
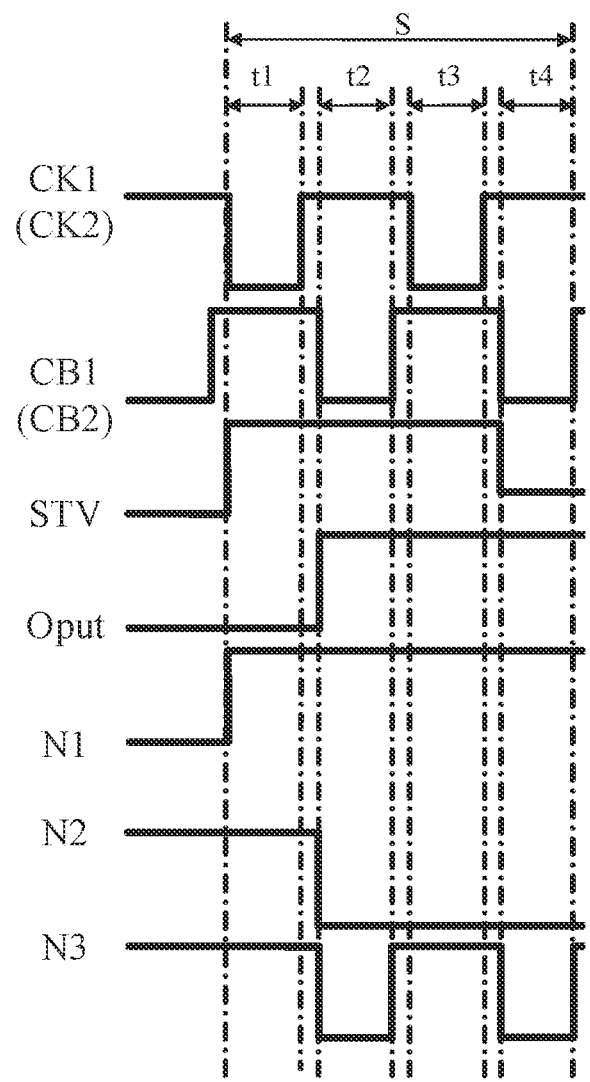
FIG. 14 is a timing diagram of a driving method of a shift register circuit in a data refresh phase, in accordance with some embodiments of the present disclosure.

It will be noted that as shown in FIGS. 12 and 14, the frame period further includes the data refresh phase S preceding the data holding phase. The data refresh phase S includes a first phase t1, a second phase t2, a third phase t3 and a fourth phase t4.

In the first phase t1 and the third phase t3, the holding unit 111 is further configured to transmit the initial voltage signal from the initial signal terminal STV to the first node N1 under the control of the first clock signal from the first clock signal terminal CK1. The first output sub-circuit 12 is further configured to be turned off under a control of the voltage of the first node N1.

In the second phase t2 and the fourth phase t4, the second control unit 113 is configured to transmit the second voltage signal from the second voltage terminal VDD to the holding unit 111 under the control of the fourth clock signal from the fourth clock signal terminal CB2 and the second control sub-circuit 13.

It can be understood that as shown in FIG. 6, the second control unit 113 transmits the second voltage signal from the second voltage terminal VDD to the holding unit 111 and the first node N1, so that the voltage of the first node N1 is a voltage of the second voltage signal. Moreover, the voltage of the second voltage signal is substantially equal to the voltage of the initial voltage signal in the first phase t1 and the third phase t3, so that the voltage of the first node N1 in the second phase t2 and the fourth phase t4 is substantially equal to the voltage of the first node N1 in the first phase t1 and the third phase t3. Thus, in the data refresh phase S, the first output sub-circuit 12 is continuously turned off under the control of the voltage of the first node N1.

In some embodiments, as shown in FIGS. 7 and 8, the second control unit 113 includes a second transistor T2 and a third transistor T3. A control electrode of the second transistor T2 is coupled to the second control sub-circuit 13, and a first electrode of the second transistor T2 is coupled to the second voltage terminal VDD.

A control electrode of the third transistor T3 is coupled to the fourth clock signal terminal CB2, a first electrode of the third transistor T3 is coupled to a second electrode of the second transistor T2, and a second electrode of the third transistor T3 is coupled to the holding unit 111 (or the fourth node N4).

The second transistor T2 is configured to be turned on under a control of a voltage signal (i.e., the first voltage signal) output from the second control sub-circuit 13 in the second phase t2 and the fourth phase t4 of the data refresh phase S. The third transistor T3 is configured to be turned on under a control of the fourth clock signal in the second phase t2 and the fourth phase t4 of the data refresh phase S. The second voltage signal received at the second voltage terminal VDD is transmitted to the holding unit 111 through the second transistor T2 and the third transistor T3.

In some embodiments, as shown in FIGS. 7 and 8, the first output sub-circuit 12 includes a tenth transistor T10. A control electrode of the tenth transistor T10 is coupled to the first node N1, a first electrode of the tenth transistor T10 is coupled to the first voltage terminal VSS, and a second electrode of the tenth transistor T10 is coupled to the signal output terminal Oput. The tenth transistor T10 is configured to: be turned off under the control of the voltage of the first node N1 in the data refresh phase S; and be turned on under the control of the turn-on voltage of the first node N1 in the data holding phase, and transmit the first voltage signal from the first voltage terminal VSS to the signal output terminal Oput.

Next, a specific structure of the second control sub-circuit 13 will be described.

In some embodiments, as shown in FIG. 6, the second control sub-circuit 13 includes a third control unit 131, an adjustment unit 132, a fourth control unit 133 and a fifth control unit 134.

The third control unit 131 is coupled to the first control sub-circuit 11, the first control signal terminal CON1 and the first voltage terminal VSS. The third control unit 131 is configured to transmit the first voltage signal from the first voltage terminal VSS to the first control sub-circuit 11 under a control of the first control signal from the first control signal terminal CON1.

It will be noted that the third control unit 131 is configured to transmit the first voltage signal from the first voltage terminal VSS to the first control sub-circuit 11 under the control of the first control signal in the first phase t1 and the third phase t3 of the data refresh phase S.

For example, FIG. 7 or FIG. 10 shows a case that the first control signal terminal CON1 is the third cock signal terminal CK2. That is, the third control unit 131 is coupled to the first control sub-circuit 11, the third clock signal terminal CK2 and the first voltage terminal VSS. The third control unit 131 is configured to transmit the first voltage signal from the first voltage terminal VSS to the first control sub-circuit 11 under a control of the third clock signal from the third clock signal terminal CK2 in the first phase t1 and the third phase t3 of the data refresh phase S.

Moreover, the third control unit 131 is further configured to output the third clock signal from the third clock signal terminal CK2 under the control of the holding unit 111 in the first control sub-circuit 11 (or under the control of the voltage of the first node N1) in the data holding phase, so as to control the second control unit 113 in the first control sub-circuit 11 to be turned off.

Figure 11:
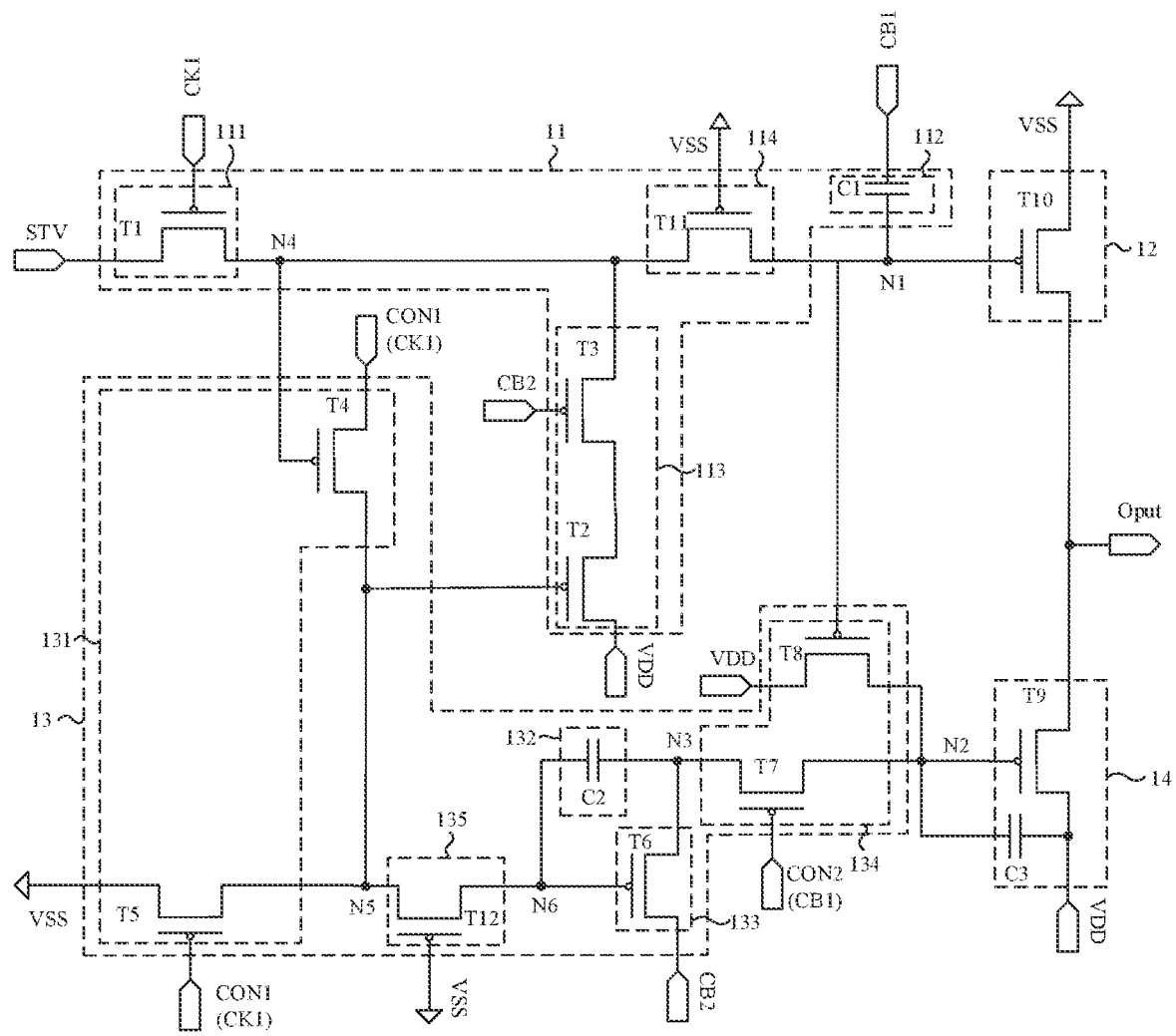
FIG. 11 is a circuit diagram of yet another shift register circuit, in accordance with some embodiments of the present disclosure.

For example, FIG. 8 or FIG. 11 shows a case that the first control signal terminal CON1 is the first clock signal terminal CK1. That is, the third control unit 131 is coupled to the first control sub-circuit 11, the first clock signal terminal CK1 and the first voltage terminal VSS. The third control unit 131 is configured to transmit the first voltage signal from the first voltage terminal VSS to the first control sub-circuit 11 under the control of the first clock signal from the first clock signal terminal CK1 in the first phase t1 and the third phase t3 of the data refresh phase S.

In some embodiments, compared to the shift register circuit RS shown in FIG. 7 or 10, in the shift register circuit RS shown in FIG. 8 or 11, the third clock signal terminal CK2 is replaced with the first clock signal terminal CK1, so that the number of clock signal terminals provided in the shift register circuit RS is reduced to three, i.e., the first clock signal terminal CK1, the second clock signal terminal CB1 and the fourth clock signal terminal CB2.

As shown in FIG. 6, the fourth control unit 133 is coupled to the third control unit 131, the fourth clock signal terminal CB2 and a third node N3. The fourth control unit 133 is configured to transmit the fourth clock signal from the fourth clock signal terminal CB2 to the third node N3 under a control of the third control unit 131.

It will be noted that the fourth control unit 133 is configured to transmit the fourth clock signal from the fourth clock signal terminal CB2 to the third node N3 under the control of the first voltage signal output from the third control unit 131 in the first phase t1 and the third phase t3 of the data refresh phase S.

Moreover, as shown in FIGS. 7 and 10, the third control unit 131 is coupled to the first control sub-circuit 11, the third clock signal terminal CK2 and the first voltage terminal VSS. In this case, the fourth control unit 133 is further configured to be turned off under the control of the third clock signal from the third clock signal terminal CK2 output from the third control unit 131 in the data holding phase.

As shown in FIG. 6, the adjustment unit 132 is coupled to the third control unit 131 and the third node N3. The adjustment unit 132 is configured to adjust a control voltage of the fourth control unit 133 according to a voltage of the third node N3.

It can be understood that the adjustment unit 132 is coupled to an output terminal of the third control unit 131 and the third node N3. The adjustment unit 132 is configured to adjust the control voltage of the fourth control unit 133 according to the voltage of the third node N3 in the second phase t2 and the fourth phase t4 of the data refresh phase S, so as to ensure that the fourth control unit 133 is stably turned on under the control of the control voltage of the fourth control unit 133.

As shown in FIG. 6, the fifth control unit 134 is coupled to the first node N1, the second node N2, the third node N3, the second voltage terminal VDD and the second control signal terminal CON2. The fifth control unit 134 is configured to: transmit the voltage of the third node N3 to the second node N2 under a control of the second control signal from the second control signal terminal CON2; and transmit the second voltage signal from the second voltage terminal VDD to the second node N2 under the control of the turn-on voltage of the first node N1.

It will be noted that the fifth control unit 134 is configured to transmit the voltage of the third node N3 to the second node N2 under the control of the second control signal in the second phase t2 and the fourth phase t4 of the data refresh phase S, so as to adjust the voltage of the second node N2 to the turn-on voltage. In this case, the second output sub-circuit 14 is configured to be turned on under the control of the turn-on voltage of the second node N2.

The fifth control unit 134 is further configured to transmit the second voltage signal from the second voltage terminal VDD to the second node N2 under the control of the turn-on voltage of the first node N1 in the data holding phase, so as to control the second output sub-circuit 14 to be turned off.

For example, FIG. 7 or FIG. 10 shows a case that the second control signal terminal CON2 is the fourth clock signal terminal CB2. That is, the fifth control unit 134 is coupled to the first node N1, the second node N2, the third node N3, the second voltage terminal VDD and the fourth clock signal terminal CB2. The fifth control unit 134 is configured to transmit the voltage of the third node N3 to the second node N2 under the control of the fourth clock signal from the fourth clock signal terminal CB2 in the second phase t2 and the fourth phase t4 of the data refresh phase S.

For example, FIG. 8 or FIG. 11 shows a case that the second control signal terminal CON2 is the second clock signal terminal CB1. That is, the fifth control unit 134 is coupled to the first node N1, the second node N2, the third node N3, the second voltage terminal VDD and the second clock signal terminal CB1. The fifth control unit 134 is configured to transmit the voltage of the third node N3 to the second node N2 under a control of the second clock signal from the second clock signal terminal CB1 in the second phase t2 and the fourth phase t4 of the data refresh phase S.

In some embodiments, as shown in FIGS. 7 and 8, the third control unit 131 includes a fourth transistor T4 and a fifth transistor T5. A control electrode of the fourth transistor T4 is coupled to the first control sub-circuit 11 (or the fourth node N4), a first electrode of the fourth transistor T4 is coupled to the first control signal terminal CON1, and a second electrode of the fourth transistor T4 is coupled to the first control sub-circuit 11 (or a fifth node N5). The fourth transistor T4 is configured to be turned on under a control of the first control sub-circuit 11 in the data holding phase to transmit the first control signal from the first control signal terminal CON1 to the second control unit 113 in the first control sub-circuit 11.

For example, as shown in FIGS. 7 and 10, the control electrode of the fourth transistor T4 is coupled to the holding unit 111 in the first control sub-circuit 11, the first electrode of the fourth transistor T4 is coupled to the third clock signal terminal CK2, and the second electrode of the fourth transistor T4 is coupled to the second control unit 113 in the first control sub-circuit 11. The fourth transistor T4 is configured to be turned on under the control of the holding unit 111 in the first control sub-circuit 11 in the data holding phase to transmit the third clock signal from the third clock signal terminal CK2 to the second control unit 113 in the first control sub-circuit 11, so as to control the second control unit 113 to be turned off.

For example, as shown in FIGS. 8 and 11, the control electrode of the fourth transistor T4 is coupled to the holding unit 111 in the first control sub-circuit 11, the first electrode of the fourth transistor T4 is coupled to the first clock signal terminal CK1, and the second electrode of the fourth transistor T4 is coupled to the second control unit 113 in the first control sub-circuit 11. The fourth transistor T4 is configured to be turned on under the control of the holding unit 111 in the first control sub-circuit 11 in the data holding phase, so as to transmit the first direct current voltage signal or the first clock signal from the first clock signal terminal CK1 to the second control unit 113 in the first control sub-circuit 11.

As shown in FIGS. 7 and 8, a control electrode of the fifth transistor T5 is coupled to the first control signal terminal CON1, a first electrode of the fifth transistor T5 is coupled to the first voltage terminal VSS, and a second electrode of the fifth transistor T5 is coupled to the first control sub-circuit 11 (or to the fifth node N5). The fifth transistor T5 is configured to be turned on under the control of the first control signal from the first control signal terminal CON1 in the first phase t1 and the third phase t3 of the data refresh phase S, so as to transmit the first voltage signal from the first voltage terminal VSS to the first control sub-circuit 11.

For example, as shown in FIG. 7, the control electrode of the fifth transistor T5 is coupled to the third clock signal terminal CK2, the first electrode of the fifth transistor T5 is coupled to the first voltage terminal VSS, and the second electrode of the fifth transistor T5 is coupled to the second control unit 113 in the first control sub-circuit 11. The fifth transistor T5 is configured to be turned on under the control of the third clock signal from the third clock signal terminal CK2 in the first phase t1 and the third phase t3 of the data refresh phase S, so as to transmit the first voltage signal from the first voltage terminal VSS to the first control sub-circuit 11.

For example, as shown in FIG. 8, the control electrode of the fifth transistor T5 is coupled to the first clock signal terminal CK1, the first electrode of the fifth transistor T5 is coupled to the first voltage terminal VSS, and the second electrode of the fifth transistor T5 is coupled to the second control unit 113 in the first control sub-circuit 11. The fifth transistor T5 is configured to be turned on under the control of the first clock signal from the first clock signal terminal CK1 in the first phase t1 and the third phase t3 of the data refresh phase S, so as to transmit the first voltage signal from the first voltage terminal VSS to the first control sub-circuit 11.

As shown in FIGS. 7 and 8, the fourth control unit 133 includes a sixth transistor T6. A control electrode of the sixth transistor T6 is coupled to the second electrode of the fourth transistor T4 (or the fifth node N5), a first electrode of the sixth transistor T6 is coupled to the fourth clock signal terminal CB2, and a second electrode of the sixth transistor T6 is coupled to the third node N3. The sixth transistor T6 is configured to: be turned on under the control of the first voltage signal output from the third control unit 131 in the first phase t1 and the third phase t3 of the data refresh phase S, and transmit the fourth clock signal from the fourth clock signal terminal CB2 to the third node N3, so that the adjustment unit 132 adjusts a control voltage of the fourth control unit 133 (i.e., a voltage of the fifth node N5) according to a voltage of the third node; and be maintained on under a control of the control voltage of the fourth control unit 133 in the second phase t2 and the fourth phase t4 of the data refresh phase S.

As shown in FIGS. 7 and 8, the adjustment unit 132 includes a second capacitor C2. A first terminal of the second capacitor C2 is coupled to the third node N3, and a second terminal of the second capacitor C2 is coupled to the second electrode of the fifth transistor T5 (or the fifth node N5). The second capacitor C2 is configured to adjust the control voltage of the fourth control unit 133 due to an action of the voltage of the third node N3 according to a bootstrap action of the second capacitor in the second phase t2 and the fourth phase t4 of the data refresh phase S.

For example, in an example where the sixth transistor T6 is of P-type, in combination with FIG. 14, in the second phase t2 and the fourth phase t4 of the data refresh phase S, the fourth clock signal received at the fourth clock signal terminal CB2 is a low level signal. In a case where the first voltage signal output from the third control unit 131 is a low level signal, according to the bootstrap action of the second capacitor C2, the control voltage of the fourth control unit 133 is further pulled down due to an action of the fourth clock signal at the third node N3, thereby ensuring that the sixth transistor T6 is turned on in the second phase t2 and the fourth phase t4 of the data refresh phase S.

As shown in FIGS. 7 and 8, the fifth control unit 134 includes a seventh transistor T7 and an eighth transistor T8. A control electrode of the seventh transistor T7 is coupled to the second control signal terminal CON2, a first electrode of the seventh transistor T7 is coupled to the third node N3, and a second electrode of the seventh transistor T7 is coupled to the second node N2. The seventh transistor T7 is configured to be turned on under the control of the second control signal from the second control signal terminal CON2 in the second phase t2 and the fourth phase t4 of the data refresh phase S, so as to transmit the voltage of the third node N3 to the second node N2.

For example, as shown in FIG. 7, the control electrode of the seventh transistor T7 is coupled to the fourth clock signal terminal CB2, the first electrode of the seventh transistor T7 is coupled to the third node N3, and the second electrode of the seventh transistor T7 is coupled to the second node N2. The seventh transistor T7 is configured to be turned on under the control of the fourth clock signal from the fourth clock signal terminal CB2 in the second phase t2 and the fourth phase t4 of the data refresh phase S, so as to transmit the voltage of the third node N3 to the second node N2.

For example, as shown in FIG. 8, the control electrode of the seventh transistor T7 is coupled to the second clock signal terminal CB1, the first electrode of the seventh transistor T7 is coupled to the third node N3, and the second electrode of the seventh transistor T7 is coupled to the second node N2. The seventh transistor T7 is configured to be turned on under the control of the second clock signal from the second clock signal terminal CB1 in the second phase t2 and the fourth phase t4 of the data refresh phase S, so as to transmit the voltage of the third node N3 to the second node N2.

As shown in FIGS. 7 and 8, a control electrode of the eighth transistor T8 is coupled to the first node N1, a first electrode of the eighth transistor T8 is coupled to the second voltage terminal VDD, and a second electrode of the eighth transistor T8 is coupled to the second node N2. The eighth transistor T8 is configured to be turned on under the control of the turn-on voltage of the first node N1 in the data holding phase to transmit the second voltage signal from the second voltage terminal VDD to the second node N2, so as to control the second output sub-circuit 14 to be turned off.

In some embodiments, as shown in FIGS. 7 and 8, the second output sub-circuit 14 includes a ninth transistor T9 and a third capacitor C3. A control electrode of the ninth transistor T9 is coupled to the second node N2, a first electrode of the ninth transistor T9 is coupled to the second voltage terminal VDD, and a second electrode of the ninth transistor T9 is coupled to the signal output terminal Oput. The ninth transistor T9 is configured to: be turned on under the control of the turn-on voltage of the second node N2 in the second phase t2 and the fourth phase t4 of the data refresh phase S, and transmit the second voltage signal from the second voltage terminal VDD to the signal output terminal Oput; and be turned off under a control of the second voltage signal transmitted to the second node N2 in the data holding phase.

A first terminal of the third capacitor C3 is coupled to the second voltage terminal VDD, and a second terminal of the third capacitor C3 is coupled to the second node N2. The third capacitor C3 is configured to maintain the voltage of the second node N2 due to an action of the second voltage signal from the second voltage terminal VDD according to a bootstrap action of the third capacitor in the data holding phase, thereby ensuring that the ninth transistor T9 is turned off.

In some embodiments, as shown in FIG. 9, the second control sub-circuit 13 further includes a second anti-leakage unit 135. The second anti-leakage unit 135 is coupled to the first voltage terminal VSS, and the third control unit 131 is coupled to the fourth control unit 133 through the second anti-leakage unit 135. The second anti-leakage unit 135 is configured to maintain the fourth control unit 133 on under a control of the first voltage signal from the first voltage terminal VSS and due to the influence of the control voltage of the fourth control unit 133.

Same as the principle of the first anti-leakage unit 114, considering an electric leakage of the fourth transistor T4 and an electric leakage of the fifth transistor T5, the second anti-leakage unit 135 functions to disconnect the fourth transistor T4 from the fourth control unit 133 and disconnect the fifth transistor T5 from the fourth control unit 133, which may avoid a change of the control voltage of the fourth control unit 133 due to the electric leakages of the fourth transistor T4 and the fifth transistor T5, thereby ensuring that the fourth control unit 133 is turned on stably.

In some embodiments, as shown in FIG. 10, the second anti-leakage unit 135 includes a twelfth transistor T12. A control electrode of the twelfth transistor T12 is coupled to the first voltage terminal VSS, a first electrode of the twelfth transistor T12 is coupled to the fourth control unit 133 (or a sixth node N6), and a second electrode of the twelfth transistor T12 is coupled to the third control unit 131 (or the fifth node N5). The twelfth transistor T12 is configured to be turned off under a control of the first voltage signal from the first voltage terminal VSS and due to the influence of the control voltage (i.e., a voltage of the sixth node N6) of the fourth control unit 133 in the second phase t2 and the fourth phase t4 of the data refresh phase S, so as to disconnect the fourth transistor T4 from the fourth control unit 133 and disconnect the fifth transistor T5 from the fourth control unit 133.

For example, in an example where the twelfth transistor T12 is of P-type, in combination with FIG. 14, in the second phase t2 and the fourth phase t4 of the data refresh phase S, the first voltage signal received at the first voltage terminal VSS is a direct current low level signal, and the fourth clock signal received at the fourth clock signal terminal CB2 is a low level signal. The second capacitor C2 is configured to pull down the control voltage of the fourth control unit 133 due to the action of the fourth clock signal at the third node N3 according to the bootstrap action of the second capacitor, so that a gate-source voltage difference $V_{gs}$ (a voltage difference between the control electrode and the first electrode of the twelfth transistor T12) of the twelfth transistor T12 is greater than or equal to 0 (i.e., $V_{gs} \geq 0$), and the twelfth transistor T12 is turned off, so as to disconnect the fourth transistor T4 from the fourth control unit 133 and disconnect the fifth transistor T5 from the fourth control unit 133.

Referring to FIGS. 7 and 8 again, the structure of the shift register circuit RS in some embodiments of the present disclosure will be integrally and exemplarily introduced below.

The shift register circuit RS includes the first control sub-circuit 11, the first output sub-circuit 12, the second control sub-circuit 13 and the second output sub-circuit 14.

The first control sub-circuit 11 includes the first transistor T1, the second transistor T2, the third transistor T3 and the first capacitor C1. The second control sub-circuit 13 includes the fourth transistor T4, the fifth transistor T5, the sixth transistor T6, the seventh transistor T7, the eighth transistor T8 and the second capacitor C2. The second output sub-circuit 14 includes the ninth transistor T9 and the third capacitor C3. The first output sub-circuit 12 includes the tenth transistor T10.

The control electrode of the first transistor T1 is coupled to the first clock signal terminal CK1, the first electrode of the first transistor T1 is coupled to the initial signal terminal STV, and the second electrode of the first transistor T1 is coupled to the first node N1. The first transistor T1 is configured to be turned on under the control of the first clock signal and due to the influence of the second clock signal, so as to maintain the voltage of the first node N1 at the turn-on voltage.

The first terminal of the first capacitor C1 is coupled to the second clock signal terminal CB1, and the second terminal of the first capacitor C1 is coupled to the first node N1. The first capacitor C1 is configured to: adjust the voltage of the first node N1 to the turn-on voltage due to the action of the second direct current voltage signal according to the bootstrap action of the first capacitor; and adjust the voltage of the first node N1 due to the action of the second clock signal.

The control electrode of the second transistor T2 is coupled to the second control sub-circuit 13, and the first electrode of the second transistor T2 is coupled to the second voltage terminal VDD. The second transistor T2 is configured to be turned on under the control of the first voltage signal output from the second control sub-circuit 13.

The control electrode of the third transistor T3 is coupled to the fourth clock signal terminal CB2, the first electrode of the third transistor T3 is coupled to the second electrode of the second transistor T2, and the second electrode of the third transistor T3 is coupled to the holding unit 111. The third transistor T3 is configured to be turned on under the control of the fourth clock signal. The second voltage signal received at the second voltage terminal VDD is transmitted to the holding unit 111 through the second transistor T2 and the third transistor T3.

The control electrode of the fourth transistor T4 is coupled to the first control sub-circuit 11, the first electrode of the fourth transistor T4 is coupled to the first control signal terminal CON1, and the second electrode of the fourth transistor T4 is coupled to the first control sub-circuit 11. The fourth transistor T4 is configured to be turned on under the control of the holding unit 111 in the first control sub-circuit 11, so as to transmit the first control signal from the first control signal terminal CON1 to the second control unit 113 in the first control sub-circuit 11.

The control electrode of the fifth transistor T5 is coupled to the first control signal terminal CON1, the first electrode of the fifth transistor T5 is coupled to the first voltage terminal VSS, and the second electrode of the fifth transistor T5 is coupled to the first control sub-circuit 11. The fifth transistor T5 is configured to be turned on under the control of the first control signal from the first control signal terminal CON1, so as to transmit the first voltage signal from the first voltage terminal VSS to the first control sub-circuit 11.

The control electrode of the sixth transistor T6 is coupled to the second electrode of the fourth transistor T4, the first electrode of the sixth transistor T6 is coupled to the fourth clock signal terminal CB2, and the second electrode of the sixth transistor T6 is coupled to the third node N3. The sixth transistor T6 is configured to: be turned on under the control of the first voltage signal output from the third control unit 131, so as to transmit the fourth clock signal from the fourth clock signal terminal CB2 to the third node N3.

The first terminal of the second capacitor C2 is coupled to the third node N3, and the second terminal of the second capacitor C2 is coupled to the second electrode of the fourth transistor T4. The second capacitor C2 is configured to adjust the control voltage of the fourth control unit 133 due to the action of the voltage of the third node N3 according to the bootstrap action of the second capacitor.

The control electrode of the seventh transistor T7 is coupled to the second control signal terminal CON2, the first electrode of the seventh transistor T7 is coupled to the third node N3, and the second electrode of the seventh transistor T7 is coupled to the second node N2. The seventh transistor T7 is configured to be turned on under the control of the second control signal from the second control signal terminal CON2, so as to transmit the voltage of the third node N3 to the second node N2.

The control electrode of the eighth transistor T8 is coupled to the first node N1, the first electrode of the eighth transistor T8 is coupled to the second voltage terminal VDD, and the second electrode of the eighth transistor T8 is coupled to the second node N2. The eighth transistor T8 is configured to be turned on under the control of the turn-on voltage of the first node N1 to transmit the second voltage signal from the second voltage terminal VDD to the second node N2, so as to control the second output sub-circuit 14 to be turned off.

The control electrode of the ninth transistor T9 is coupled to the second node N2, the first electrode of the ninth transistor T9 is coupled to the second voltage terminal VDD, and the second electrode of the ninth transistor T9 is coupled to the signal output terminal Oput. The ninth transistor T9 is configured to: be turned on under the control of the turn-on voltage of the second node N2, and transmit the second voltage signal from the second voltage terminal VDD to the signal output terminal Oput; and be turned off under the control of the second voltage signal transmitted to the second node N2.

The first terminal of the third capacitor C3 is coupled to the second voltage terminal VDD, and the second terminal of the third capacitor C3 is coupled to the second node N2. The third capacitor C3 is configured to maintain the voltage of the second node N2 due to the action of the second voltage signal from the second voltage terminal VDD according to the bootstrap action of the third capacitor, thereby ensuring that the ninth transistor T9 is turned off.

The control electrode of the tenth transistor T10 is coupled to the first node N1, the first electrode of the tenth transistor T10 is coupled to the first voltage terminal VSS, and the second electrode of the tenth transistor T10 is coupled to the signal output terminal Oput. The tenth transistor T10 is configured to: be turned off under the control of the voltage of the first node N1; and be turned on under the control of the turn-on voltage of the first node N1, and transmit the first voltage signal from the first voltage terminal VSS to the signal output terminal Oput.

In the embodiments of the present disclosure, specific implementations of any one of the first control sub-circuit 11, the first output sub-circuit 12, the second control sub-circuit 13 and the second output sub-circuit 14 are not limited to the above description, and may be any used implementations, such as a conventional connection that is well known to those skilled in the art, as long as corresponding functions are guaranteed to be realized. The above examples do not limit the protection scope of the present disclosure. In practical applications, a skilled person may choose to use or not use one or more of the above circuits according to situations. Various combination modifications of the above circuits do not depart from the principle of the present disclosure, and will not be repeated.

The gate driving circuit G in some embodiments of the present disclosure further includes three or four clock signal lines coupled to the shift register circuits RS in the gate driving circuit G.

It will be noted that as shown in FIG. 2B, the clock signal lines may be coupled to a timing controller TCON in the display device 200 for transmitting a voltage signal from the timing controller TCON to the shift register circuits.

For example, as shown in FIG. 2B, the gate driving circuit G includes four clock signal lines, i.e., a first clock signal line CLK1, a second clock signal line CLK2, a third clock signal line CLK3 and a fourth clock signal line CLK4.

A first clock signal terminal CK1 in a (2N−1)-th stage shift register circuit is coupled to the first clock signal line CLK1. A second clock signal terminal CB1 in the (2N−1)-th stage shift register circuit is coupled to the second clock signal line CLK2. A third clock signal terminal CK2 in the (2N−1)-th stage shift register circuit is coupled to the third clock signal line CLK3. A fourth clock signal terminal CB2 in the (2N−1)-th stage shift register circuit is coupled to the fourth clock signal line CLK4.

Moreover, a first clock signal terminal CK1 in a 2N-th stage shift register circuit is coupled to the second clock signal line CLK2. A second clock signal terminal CB1 in the 2N-th stage shift register circuit is coupled to the first clock signal line CLK1. A third clock signal terminal CK2 in the 2N-th stage shift register circuit is coupled to the fourth clock signal line CLK4. A fourth clock signal terminal CB2 in the 2N-th stage shift register circuit is coupled to the third clock signal line CLK3. Here, N is a positive integer.

It can be understood that in the above example, a first clock signal terminal CK1 in an odd-numbered stage shift register circuit and a second clock signal terminal CB1 in an even-numbered stage shift register circuit are coupled to the first clock signal line CLK1, so as to input a signal from the first clock signal line CLK1 thereto. On the contrary, a first clock signal terminal CK1 in the even-numbered stage shift register circuit and a second clock signal terminal CB1 in the odd-numbered stage shift register circuit are coupled to the second clock signal line CLK2, so as to input a signal from the second clock signal line CLK2 thereto.

Similarly, a third clock signal terminal CK2 in the odd-numbered stage shift register circuit and a fourth clock signal terminal CB2 in the even-numbered stage shift register circuit are coupled to the third clock signal line CLK3, so as to input a signal from the third clock signal line CLK3 thereto. On the contrary, a third clock signal terminal CK2 in the even-numbered stage shift register circuit and a fourth clock signal terminal CB2 in the odd-numbered stage shift register circuit are coupled to the fourth clock signal line CLK4, so as to input a signal from the fourth clock signal line CLK4 thereto.

For example, compared to the shift register circuit RS shown in FIG. 7 or 9, in the shift register circuit RS shown in FIG. 8 or 10, the third clock signal terminal CK2 is replaced with the first clock signal terminal CK1, so that the number of clock signal terminals provided in the shift register circuit RS is reduced to three, i.e., the first clock signal terminal CK1, the second clock signal terminal CB1 and the fourth clock signal terminal CB2. Accordingly, the third clock signal line CLK3 may be omitted from the gate driving circuit G. That is, the gate driving circuit G includes three clock signal lines. By reducing the number of signal lines, a difficulty of arranging signal lines in the peripheral area BB of the display panel 100 may be reduced, and an area of the peripheral area BB occupied by signal lines is reduced, which is beneficial to realizing narrow bezel of the display device 200.

Some embodiments of the present disclosure further provide a driving method of a shift register circuit. Before introducing the driving method, a display process of the display device will be firstly introduced.

In the field of display technologies, for example, for a liquid crystal display device, an image of a frame refers to drawing an image on a display screen by row-by-row scanning or interlaced scanning. For example, as shown in FIGS. 2A and 2B, in the display panel 100, a plurality of sub-pixels P included in the display panel 100 are arranged in an array including N rows and M columns. In the display process, by the row-by-row scanning, scan signals are input to sub-pixels P in a first row to sub-pixels P in an N-th row, row by row, respectively through a first control signal line L1 to an N-th control signal line L(N), so as to control sub-pixels P to be turned on row by row. When sub-pixels P in each row are turned on, the data lines DL input corresponding data signals to respective sub-pixels (including M sub-pixels in total) in the sub-pixels P in the row, so as to light up the plurality of sub-pixels P from the first row to the N-th row to display a corresponding image, and thus, the image of the frame is drawn or displayed. Next, by the row-by-row scanning as well, the plurality of sub-pixels P are lighted up again from the first row to the N-th row to display a corresponding image, and thus, an image of next frame is drawn or displayed.

Typically, a refresh frequency of the display device may be 60 Hz. That is, the display device may display 60 frames of images per second, with a display period of 1/60 seconds per frame of image. Since human eyes have persistence of vision, there may be a case that the human eyes do not feel any change of an image on the display device within a second when a still screen is displayed, but actually the image on the display device has been repeatedly displayed 60 times. In a case where the refresh frequency of the display device is sufficiently high, the human eyes do not feel flickering due to screen switching.

That is, the display process of the display device includes a plurality of frame periods, and the sub-pixels P in the N rows are scanned in each frame period to display an image of a frame. For a gate driving circuit, in each frame period, N stages of shift register circuits included in the gate driving circuit output respective scan signals in sequence. That is, a first stage shift register to an N-th stage shift register output respective scan signals in sequence, so as to scan control signal lines L row by row.

On this basis, considering the first stage shift register circuit RS1 in the gate driving circuit G (formed by cascading the shift register circuits in FIG. 7) shown in FIG. 2B as an example, the driving method of the shift register circuit in an image frame (i.e., a frame period) will be described below in combination with the timing diagrams in FIGS. 12 and 14.

As shown in FIG. 12, the driving method of the shift register circuit RS includes following steps. The frame period includes the data holding phase, and the data holding phase includes the plurality of denoising sub-phases and the plurality of denoising enhancement sub-phases. The denoising sub-phases and the denoising enhancement sub-phases are alternated, which is equivalent to inserting the plurality of denoising enhancement sub-phases in the data holding phase.

In the denoising sub-phase, the first control sub-circuit 11 in the shift register circuit RS adjusts the voltage of the first node N1 to the turn-on voltage due to the influence of the first direct current voltage signal from the first clock signal terminal CK1, the initial voltage signal from the initial signal terminal and the second direct current voltage signal from the second clock signal terminal CB1. Compared to the alternating current voltage signal, the first direct current voltage signal and the second direct current voltage signal are used in the first control sub-circuit 11, which may reduce the power consumption of the display device 200.

In the denoising enhancement sub-phase, the first control sub-circuit 11 maintains the voltage of the first node N1 at the turn-on voltage due to the influence of the first clock signal from the first clock signal terminal CK1 and the second clock signal from the second clock signal terminal CB1, which may avoid the change of the voltage of the first node N1 due to the electric leakage of the transistor in the shift register circuit RS, thereby ensuring that the first output sub-circuit 12 is turned on stably.

In the data holding phase, the voltage of the first node N1 is maintained at the turn-on voltage, and the first output sub-circuit 12 in the shift register circuit RS is turned on under the control of the turn-on voltage of the first node N1 to transmit the first voltage signal from the first voltage terminal VSS to the signal output terminal Oput.

It can be understood that in the data holding phase, compared to a duration of the denoising enhancement sub-phase, a duration of the denoising sub-phase should be prolonged as much as possible, so as to reduce the power consumption of the display device 200.

For example, the duration of the denoising sub-phase may be in a range of 0.1 ms to 1000 ms, such as 0.1 ms, 10 ms, 500 ms, 800 ms or 1000 ms.

Moreover, the number of denoising enhancement sub-phases inserted in the data holding phase may be adjusted according to a level of the electric leakage of the transistor in the shift register circuit RS. The number of inserted denoising enhancement sub-phases should be as small as possible, so as to ensure that the first output sub-circuit 12 is turned on stably, and the power consumption of the display device 200 may be reduced.

For example, in the data holding phase, 1 to 20 denoising enhancement sub-phases may be inserted every 1 ms. For example, 1 denoising enhancement sub-phase is inserted every 1 ms, 5 denoising enhancement sub-phases are inserted every 1 ms, 10 denoising enhancement sub-phases are inserted every 1 ms, 15 denoising enhancement sub-phases are inserted every 1 ms, or 20 denoising enhancement sub-phases are inserted every 1 ms.

Figure 13:
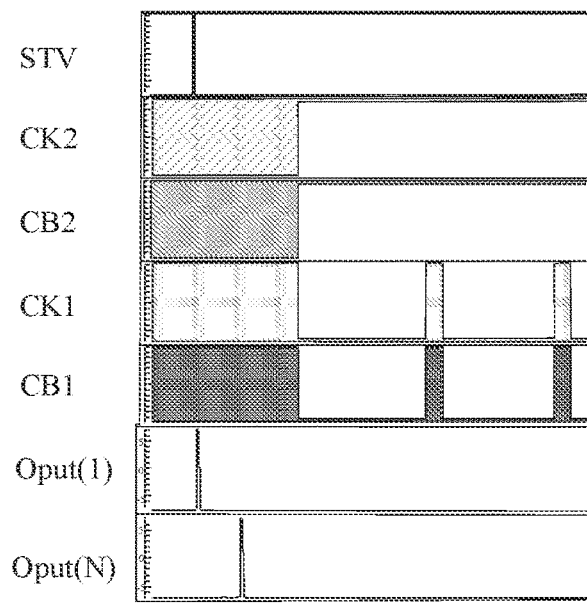
FIG. 13 is a simulation diagram of a simulation experiment on a driving method of a shift register circuit, in accordance with some embodiments of the present disclosure.

In order to verify effects of the above driving method, a simulation experiment was performed on a light-emitting control circuit formed by cascading the shift register circuits RS. As shown in FIG. 13, each stage of shift register circuit RS in the light-emitting control circuit was driven according to the above driving method, and output noise of the signal output terminal Oput in the shift register circuit RS was detected. Experiment results are shown in Table 1 below.

TABLE 1

| Driving method | Output noise | Consumption of GOA | Energy saving ratio |
| --- | --- | --- | --- |
| Insert pulse | 0 V | 9.5 mW | 82% |
| 60 Hz Clock | 0 V | 52 mW | 0 |
| VSS | NG($|V_{th}|$) | — | — |
| VDD | NG($|V_{th}|$~VDD) | — | — |

The "insert pulse" refers to the driving method of the shift register circuit RS in the embodiments of the present disclosure. The "60 Hz Clock" refers to a driving method of a shift register circuit in the related art. That is, in a case where a refresh frequency of a display device is 60 Hz, the shift register circuit was driven by using a clock signal (an alternating current voltage signal). The "VSS" refers to a driving method of the shift register circuit RS by using the first voltage signal from the first voltage terminal VSS. The "VDD" refers to a driving method of the shift register circuit RS by using the second voltage signal from the second voltage terminal VDD.

It can be seen that compared to the driving method of the shift register circuit in the related art, in the driving method of the shift register circuit RS in the embodiments of the present disclosure, a voltage of the output noise of the shift register circuit RS is also 0 V, and the total power consumption of the gate driving circuit is 9.5 mW (which is 52 mW for the "60 Hz Clock" driving method), and the energy saving ratio reaches 82%. Therefore, the driving method of the shift register circuit RS in the embodiments of the present disclosure may reduce the power consumption of the display device 200 while ensuring that the output noise of the shift register circuit RS is low.

Moreover, in a case where no pulse was inserted, the shift register circuit RS was driven by using a direct current voltage signal. That is, the shift register circuit RS was driven by using the first voltage signal from the first voltage terminal VSS, and a voltage of the output noise of the shift register circuit RS is $|V_{th}|$. Or, the shift register circuit RS was driven by using the second voltage signal from the second voltage terminal VDD, and a voltage of the output noise of the shift register circuit RS is in a range of $|V_{th}|$ to VDD. It can be understood that due to the electric leakage of the transistor in the shift register circuit RS, the shift register circuit RS was driven by only using the direct current voltage signal, which may reduce the power consumption of the display device, but cannot solve a problem of the output noise of the shift register circuit RS.

In some embodiments, the first control sub-circuit 11 includes the holding unit 111 and the first control unit 112. The first control sub-circuit 11 adjusting the voltage of the first node N1 to the turn-on voltage due to the influence of the first direct current voltage signal from the first clock signal terminal CK1, the initial voltage signal from the initial signal terminal and the second direct current voltage signal from the second clock signal terminal CB1, includes following steps.

The holding unit 111 is turned off due to the influence of the first direct current voltage signal from the first clock signal terminal CK1 and the initial voltage signal from the initial signal terminal STV. The first control unit 112 adjusts the voltage of the first node N1 to the turn-on voltage due to the influence of the second direct current voltage signal from the second clock signal terminal CB1.

For example, referring to FIGS. 7 and 12, in a case where the holding unit 111 in the first control sub-circuit 11 includes the first transistor T1, and the first control unit 112 in the first control sub-circuit 11 includes the first capacitor C1, in the denoising sub-phase, following steps are included.

The first direct current voltage signal is a low level signal, and the second direct current voltage signal is a low level signal. The first transistor T1 is turned off under a control of the first direct current voltage signal and the initial voltage signal. The first capacitor C1 adjusts the voltage of the first node N1 to the turn-on voltage due to the action of the second direct current voltage signal according to the bootstrap action of the first capacitor.

The first control sub-circuit 11 maintaining the voltage of the first node N1 at the turn-on voltage due to the influence of the first clock signal from the first clock signal terminal CK1 and the second clock signal from the second clock signal terminal CB1, includes following steps.

The first control unit 112 adjusts the voltage of the first node N1 due to the influence of the second clock signal from the second clock signal terminal CB1. The holding unit 111 is turned on under the control of the first clock signal from the first clock signal terminal CK1 and due to the influence of the second clock signal from the second clock signal terminal CB1 to maintain the voltage of the first node N1 at the turn-on voltage.

For example, referring to FIGS. 7 and 11, in the case where the holding unit 111 in the first control sub-circuit 11 includes the first transistor T1, and the first control unit 112 in the first control sub-circuit 11 includes the first capacitor C1, in the denoising enhancement sub-phase, following steps are included.

The second clock signal is a high level signal, and the first clock signal is a low level signal. The first capacitor C1 adjusts the voltage of the first node N1 due to the action of the second clock signal. The first transistor T1 is turned on under the control of the first clock signal and due to the influence of the second clock signal to maintain the voltage of the first node N1 at the turn-on voltage.

For example, in a case where the first output sub-circuit 12 includes the tenth transistor T10, in the data holding phase, a following step is included.

The tenth transistor T10 is turned on under the control of the turn-on voltage of the first node N1 to transmit the first voltage signal from the first voltage terminal VSS to the signal output terminal Oput.

In some embodiments, as shown in FIG. 12, the frame period further includes the data refresh phase S preceding the data holding phase. As shown in FIG. 14, the data refresh phase S includes the first phase t1, the second phase t2, the third phase t3 and the fourth phase t4.

The second control sub-circuit 13 in the shift register circuit RS includes the third control unit 131, the adjustment unit 132, the fourth control unit 133 and the fifth control unit 134. In the first phase t1 and the third phase t3, the third control unit 131 transmits the first voltage signal from the first voltage terminal VSS to the first control sub-circuit 11 under the control of the first control signal (i.e., the third clock signal) from the first control signal terminal CON1 (i.e., the third clock signal terminal CK2). The fourth control unit 133 transmits the fourth clock signal from the fourth clock signal terminal CB2 to the third node N3 under the control of the first voltage signal output from the third control unit 131.

For example, referring to FIGS. 7 and 14, in a case where the third control unit 131 includes the fourth transistor T4 and the fifth transistor T5, and the fourth control unit 133 includes the sixth transistor T6, in the first phase t1 and the third phase t3, following steps are included.

The fourth transistor T4 is turned off under the control of the first control sub-circuit 11. That is, the first control sub-circuit 11 controls the voltage of the first node N1 to be at a high level, and the fourth transistor T4 is turned off under the control of the voltage of the first node N1.

The third clock signal is a low level signal. The fifth transistor T5 is turned on under the control of the third clock signal from the third clock signal terminal CK2 to transmit the first voltage signal from the first voltage terminal VSS to the first control sub-circuit 11.

The first voltage signal output from the third control unit 131 is a low level signal. The sixth transistor T6 is turned on under the control of the first voltage signal output from the third control unit 131 to transmit the fourth clock signal from the fourth clock signal terminal CB2 to the third node N3. Since the fourth clock signal is a high level signal, the voltage of the third node N3 is at a high level.

In the second phase t2 and the fourth phase t4, the adjustment unit 132 adjusts the control voltage of the fourth control unit 133 according to the voltage of the third node N3. Moreover, the fourth control unit 133 is maintained on under the control of the control voltage of the fourth control unit 133, so as to transmit the fourth clock signal from the fourth clock signal terminal CB2 to the third node N3.

The fifth control unit 134 transmits the voltage of the third node N3 to the second node N2 under the control of the second control signal from the second control signal terminal CON2.

The second output sub-circuit 14 is turned on under the control of the turn-on voltage of the second node N2 to transmit the second voltage signal from the second voltage terminal VDD to the signal output terminal Oput.

For example, referring to FIGS. 7 and 14, in a case where the adjustment unit 132 includes the second capacitor C2, the fifth control unit 134 includes the seventh transistor T7 and the eighth transistor T8, and the second output sub-circuit 14 includes the ninth transistor T9, in the second phase t2 and the fourth phase t4, following steps are included.

The second capacitor C2 adjusts the control voltage of the fourth control unit 133 due to the action of the voltage of the third node N3 according to the bootstrap action of the second capacitor.

It can be understood that in the first phase t1 and the third phase t3, the first voltage signal output from the third control unit 131 is a low level signal. In the second phase t2 and the fourth phase t4, the fourth clock signal is a low level signal. Therefore, the voltage of the third node N3 is at a low level, and the second capacitor C2 pulls down the control voltage of the fourth control unit 133 due to the action of the voltage of the third node N3, so that the sixth transistor T6 is maintained on to transmit the fourth clock signal from the fourth clock signal terminal CB2 to the third node N3.

The seventh transistor T7 is turned on under the control of the fourth clock signal from the fourth clock signal terminal CB2 to transmit the voltage of the third node N3 to the second node N2, so that the voltage of the second node N2 at a low level.

The ninth transistor T9 is turned on under the control of the turn-on voltage of the second node N2 to transmit the second voltage signal from the second voltage terminal VDD to the signal output terminal Oput.

It will be noted that the transistors used in the shift register circuit in the embodiments of the present disclosure may be thin film transistors, field effect transistors or other switching devices with same characteristics.

In the transistors in the embodiments of the present disclosure, a control electrode of a transistor is a gate of the transistor, a first electrode of the transistor is one of a source and a drain of the transistor, and a second electrode of the transistor is another other of the source and the drain of the transistor. Since the source and the drain of the transistor may be symmetrical in structure, the source and the drain of the transistor may be same in structure. That is, the first electrode and the second electrode of the transistor in the embodiments of the present disclosure may be same in structure.

The shift register circuit in the embodiments of the present disclosure is described in an example where the transistors are P-type transistors. It will be noted that the embodiments of the present disclosure include but are not limited thereto. For example, one or more transistors in the shift register circuit in the embodiments of the present disclosure may also be N-type transistor(s), and it is only necessary to correspondingly connect respective electrodes of a transistor of a selected type with reference to respective electrodes of a corresponding transistor in the embodiments of the present disclosure, and to enable a corresponding voltage terminal to provide a corresponding high or low voltage.

In the embodiments of the present disclosure, the first capacitor C1, the second capacitor C2 and the third capacitor C3 may be capacitors that are separately manufactured by a process. For example, the capacitor is realized by manufacturing special capacitor electrodes, and each capacitor electrode of the capacitor may be realized by a metal layer, a semiconductor layer (e.g., doped with polysilicon), or the like. The capacitor may also be realized by a parasitic capacitance between thin film transistors, by a parasitic capacitance between a thin film transistor and other device or wiring, or by a parasitic capacitance between a circuit's own wirings.

In the circuits in the embodiments of the present disclosure, the first node N1, the second node N2, the third node N3, the fourth node N4, the fifth node N5 and the sixth node N6 do not represent actual components, but represent junctions of related electrical connections in circuit diagrams. That is, these nodes are nodes that are equivalent to the junctions of the related electrical connections in the circuit diagrams.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A shift register circuit, comprising:
    a first control sub-circuit coupled to a first clock signal terminal, a second clock signal terminal, an initial signal terminal and a first node; the first control sub-circuit being configured to:
        adjust a voltage of the first node to a turn-on voltage due to an influence of a first direct current voltage signal from the first clock signal terminal, an initial voltage signal from the initial signal terminal and a second direct current voltage signal from the second clock signal terminal; and
        maintain the voltage of the first node at the turn-on voltage due to an influence of a first clock signal from the first clock signal terminal and a second clock signal from the second clock signal terminal;
    a first output sub-circuit coupled to the first node, a first voltage terminal and a signal output terminal;
    the first output sub-circuit being configured to be turned on under a control of the turn-on voltage of the first node to transmit a first voltage signal from the first voltage terminal to the signal output terminal;
    a second control sub-circuit coupled to the first node, the first voltage terminal, a first control signal terminal, a second control signal terminal, a fourth clock signal terminal, a second voltage terminal, a second node and the first control sub-circuit;
    the second control sub-circuit being configured to:
        under a control of a first control signal from the first control signal terminal and a second control signal from the second control signal terminal, and due to an influence of the first voltage signal from the first voltage terminal and a fourth clock signal from the fourth clock signal terminal, adjust a voltage of the second node to a turn-on voltage; and
        transmit the first voltage signal from the first voltage terminal to the first control sub-circuit under a control of the first control signal from the first control signal terminal; and
    a second output sub-circuit coupled to the second node, the second voltage terminal and the signal output terminal;
    the second output sub-circuit being configured to:
        be turned on under a control of the turn-on voltage of the second node to transmit a second voltage signal from the second voltage terminal to the signal output terminal;
    wherein the first control sub-circuit includes:
        a holding unit coupled to the first clock signal terminal, the first node and the initial signal terminal;
        the holding unit being configured to:
            be turned off due to an influence of the first direct current voltage signal from the first clock signal terminal and the initial voltage signal from the initial signal terminal; and
            be turned on under a control of the first clock signal from the first clock signal terminal and due to an influence of the second clock signal from the second clock signal terminal, so as to maintain the voltage of the first node at the turn-on voltage; and
        a first control unit coupled to the second clock signal terminal and the first node;
        the first control unit being configured to:
            adjust the voltage of the first node to the turn-on voltage due to an influence of the second direct current voltage signal from the second clock signal terminal; and
            adjust the voltage of the first node due to the influence of the second clock signal from the second clock signal terminal.

2. The shift register circuit according to claim 1, wherein the holding unit includes:
    a first transistor, a control electrode of the first transistor being coupled to the first clock signal terminal, a first electrode of the first transistor being coupled to the initial signal terminal, and a second electrode of the first transistor being coupled to the first node;
    the first control unit includes:
    a first capacitor, a first terminal of the first capacitor being coupled to the second clock signal terminal, and a second terminal of the first capacitor being coupled to the first node.

3. The shift register circuit according to claim 1, wherein the first control sub-circuit further includes:
    a first anti-leakage unit coupled to the first voltage terminal;
    the holding unit being coupled to the first node through the first anti-leakage unit;
    the first anti-leakage unit being configured to maintain the turn-on voltage of the first node under a control of the first voltage signal from the first voltage terminal and due to an influence of the turn-on voltage of the first node.

4. The shift register circuit according to claim 3, wherein the first anti-leakage unit includes:
    an eleventh transistor, a control electrode of the eleventh transistor being coupled to the first voltage terminal, a first electrode of the eleventh transistor being coupled to the first node, and a second electrode of the eleventh transistor being coupled to the holding unit.

5. The shift register circuit according to claim 1, wherein the first control sub-circuit further includes:
a second control unit coupled to the holding unit, the second control sub-circuit, the fourth clock signal terminal and the second voltage terminal;
the second control unit being configured to transmit the second voltage signal from the second voltage terminal to the holding unit under a control of the fourth clock signal from the fourth clock signal terminal and the second control sub-circuit.

6. The shift register circuit according to claim 5, wherein the second control unit includes:
a second transistor, a control electrode of the second transistor being coupled to the second control sub-circuit, and a first electrode of the second transistor being coupled to the second voltage terminal; and
a third transistor, a control electrode of the third transistor being coupled to the fourth clock signal terminal, a first electrode of the third transistor being coupled to a second electrode of the second transistor, and a second electrode of the third transistor being coupled to the holding unit.

7. The shift register circuit according to claim 5, wherein the second control sub-circuit includes a third control unit, a fourth control unit, an adjustment unit and a fifth control unit, wherein the third control unit is coupled to the holding unit, the second control unit, the first control signal terminal, the fourth control unit, the adjustment unit and the first voltage terminal;
the third control unit is configured to transmit the first voltage signal from the first voltage terminal to the second control unit and the fourth control unit under the control of the first control signal from the first control signal terminal;
the fourth control unit is further coupled to the fourth clock signal terminal and a third node;
the fourth control unit is configured to transmit the fourth clock signal from the fourth clock signal terminal to the third node under a control of the first voltage signal output from the third control unit;
the adjustment unit is further coupled to the third node;
the adjustment unit is configured to adjust a control voltage of the fourth control unit according to a voltage of the third node; and
the fifth control unit is coupled to the first node, the second node, the third node, the second voltage terminal and the second control signal terminal; the fifth control unit is configured to:
transmit the voltage of the third node to the second node under a control of the second control signal from the second control signal terminal; and
transmit the second voltage signal from the second voltage terminal to the second node under the control of the turn-on voltage of the first node.

8. The shift register circuit according to claim 7, wherein the third control unit includes:
a fourth transistor, a control electrode of the fourth transistor being coupled to the first control sub-circuit, a first electrode of the fourth transistor being coupled to the first control signal terminal, and a second electrode of the fourth transistor being coupled to the first control sub-circuit; and
a fifth transistor, a control electrode of the fifth transistor being coupled to the first control signal terminal, a first electrode of the fifth transistor being coupled to the first voltage terminal, and a second electrode of the fifth transistor being coupled to the first control sub-circuit and the fourth control unit;
the fourth control unit includes:
a sixth transistor, a control electrode of the sixth transistor being coupled to the second electrode of the fourth transistor or the fifth transistor, a first electrode of the sixth transistor being coupled to the fourth clock signal terminal, and a second electrode of the sixth transistor being coupled to the third node;
the adjustment unit includes:
a second capacitor, a first terminal of the second capacitor being coupled to the third node, and a second terminal of the second capacitor being coupled to the second electrode of the fourth transistor or the fifth transistor; and
the fifth control unit includes:
a seventh transistor, a control electrode of the seventh transistor being coupled to the second control signal terminal, a first electrode of the seventh transistor being coupled to the third node, and a second electrode of the seventh transistor being coupled to the second node; and
an eighth transistor, a control electrode of the eighth transistor being coupled to the first node, a first electrode of the eighth transistor being coupled to the second voltage terminal, and a second electrode of the eighth transistor being coupled to the second node.

9. The shift register circuit according to claim 7, wherein the second control sub-circuit further includes:
a second anti-leakage unit coupled to the first voltage terminal;
the third control unit being coupled to the fourth control unit through the second anti-leakage unit;
the second anti-leakage unit being configured to maintain the fourth control unit on under a control of the first voltage signal from the first voltage terminal and due to an influence of the control voltage of the fourth control unit.

10. The shift register circuit according to claim 9, wherein the second anti-leakage unit includes:
a twelfth transistor, a control electrode of the twelfth transistor being coupled to the first voltage terminal, a first electrode of the twelfth transistor being coupled to the fourth control unit, and a second electrode of the twelfth transistor being coupled to the third control unit.

11. The shift register circuit according to claim 1, wherein the first control signal terminal is one of the first clock signal terminal and a third clock signal terminal; and/or,
the second control signal terminal is one of the second clock signal terminal and the fourth clock signal terminal; and
the first clock signal terminal is configured to output the first clock signal in a data refresh phase of a frame period, to output the first direct current voltage signal in a denoising sub-phase of a data holding phase of the frame period, and to output the first clock signal in a denoising enhancement sub-phase of the data holding phase of the frame period;
the second clock signal terminal is configured to output the second clock signal in the data refresh phase, to output the second direct current voltage signal in the denoising sub-phase of the data holding phase, and to output the second clock signal in the denoising enhancement sub-phase of the data holding phase;

the third clock signal terminal is configured to output a third clock signal in the data refresh phase, and to output a third direct current voltage signal in the data holding phase;

the fourth clock signal terminal is configured to output the fourth clock signal in the data refresh phase, and to output a fourth direct current voltage signal in the data holding phase.

12. The shift register circuit according to claim 11, wherein the first clock signal and the second clock signal are substantially mutually inverted signals, and the third clock signal and the fourth clock signal are substantially mutually inverted signals;

the first direct current voltage signal and the second direct current voltage signal are low level signals, and the third direct current voltage signal and the fourth direct current voltage signal are high level signals.

13. The shift register circuit according to claim 1, wherein the second output sub-circuit includes:

a ninth transistor, a control electrode of the ninth transistor being coupled to the second node, a first electrode of the ninth transistor being coupled to the second voltage terminal, and a second electrode of the ninth transistor being coupled to the signal output terminal; and a third capacitor, a first terminal of the third capacitor being coupled to the second voltage terminal, and a second terminal of the third capacitor being coupled to the second node.

14. A gate driving circuit, comprising:

a plurality of shift register circuits according to claim 1, the plurality of shift register circuits being cascaded in sequence.

15. A display device, comprising:

the gate driving circuit according to claim 14; and a plurality of control signal lines, each shift register circuit in the gate driving circuit being coupled to at least one control signal line.

16. A driving method of a shift register circuit applied to the shift register circuit according to claim 1, a frame period including a data holding phase, and the data holding phase including a plurality of denoising sub-phases and a plurality of denoising enhancement sub-phases that are alternated; the driving method comprising:

in a denoising sub-phase, adjusting, by the first control sub-circuit in the shift register circuit, the voltage of the first node to the turn-on voltage due to the influence of the first direct current voltage signal from the first clock signal terminal, the initial voltage signal from the initial signal terminal and the second direct current voltage signal from the second clock signal terminal;

in a denoising enhancement sub-phase, maintaining, by the first control sub-circuit, the voltage of the first node at the turn-on voltage due to the influence of the first clock signal from the first clock signal terminal and the second clock signal from the second clock signal terminal; and in the data holding phase, the first output sub-circuit in the shift register circuit being turned on under the control of the turn-on voltage of the first node, and transmitting the first voltage signal from the first voltage terminal to the signal output terminal;

wherein the first control sub-circuit includes a holding unit and a first control unit;

adjusting, by the first control sub-circuit, the voltage of the first node to the turn-on voltage due to the influence of the first direct current voltage signal from the first clock signal terminal, the initial voltage signal from the initial signal terminal and the second direct current voltage signal from the second clock signal terminal, includes:

the holding unit being turned off due to an influence of the first direct current voltage signal from the first clock signal terminal and the initial voltage signal from the initial signal terminal; and adjusting, by the first control unit, the voltage of the first node to the turn-on voltage due to an influence of the second direct current voltage signal from the second clock signal terminal;

maintaining, by the first control sub-circuit, the voltage of the first node at the turn-on voltage due to the influence of the first clock signal from the first clock signal terminal and the second clock signal from the second clock signal terminal, includes:

adjusting, by the first control unit, the voltage of the first node due to an influence of the second clock signal from the second clock signal terminal; and the holding unit being turned on under a control of the first clock signal from the first clock signal terminal and due to an influence of the second clock signal from the second clock signal terminal to maintain the voltage of the first node at the turn-on voltage.

17. The driving method according to claim 16, wherein the frame period further includes a data refresh phase, and the data refresh phase includes a first phase, a second phase, a third phase and a fourth phase;

a second control sub-circuit in the shift register circuit includes a third control unit, a fourth control unit, a fifth control unit and an adjustment unit;

the driving method further comprises:

in the first phase and the third phase:

transmitting, by the third control unit, the first voltage signal from the first voltage terminal to the second control unit and the fourth control unit under a control of a first control signal from the first control signal terminal;

transmitting, by the fourth control unit, a fourth clock signal from a fourth clock signal terminal to a third node under a control of the first voltage signal output from the third control unit;

in the second phase and the fourth phase;

adjusting, by the adjustment unit, a control voltage of the fourth control unit according to a voltage of the third node;

transmitting, by the fourth control unit, the fourth clock signal from the fourth clock signal terminal to the third node under the control of the first voltage signal output from the third control unit;

transmitting, by the fifth control unit, the voltage of the third node to a second node under a control of a second control signal from a second control signal terminal; and transmitting, by a second output sub-circuit turned on under a control of a turn-on voltage of the second node, a second voltage signal from a second voltage terminal to the signal output terminal.

* * * * *